US011855050B2

(12) United States Patent
Kim et al.

(10) Patent No.: US 11,855,050 B2
(45) Date of Patent: Dec. 26, 2023

(54) MICRO-LED DISPLAYS, MICRO-LED TRANSFERRING SUBSTRATES, AND METHODS OF TRANSFERRING MICRO-LEDS USING THE MICRO-LED TRANSFERRING SUBSTRATES

(71) Applicant: SAMSUNG ELECTRONICS CO., LTD., Suwon-si (KR)

(72) Inventors: Hyunjoon Kim, Seoul (KR); Kyungwook Hwang, Seoul (KR); Joonyong Park, Suwon-si (KR); Seogwoo Hong, Yongin-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 91 days.

(21) Appl. No.: 17/232,964

(22) Filed: Apr. 16, 2021

(65) Prior Publication Data
US 2022/0115359 A1 Apr. 14, 2022

(30) Foreign Application Priority Data

Oct. 8, 2020 (KR) .......................... 10-2020-0130410
Mar. 31, 2021 (KR) .......................... 10-2021-0042223

(51) Int. Cl.
H01L 25/075 (2006.01)
H01L 25/16 (2023.01)
H01L 33/20 (2010.01)

(52) U.S. Cl.
CPC ........ H01L 25/0753 (2013.01); H01L 25/167 (2013.01); H01L 33/20 (2013.01)

(58) Field of Classification Search
CPC .... H01L 25/0753; H01L 25/167; H01L 33/20
See application file for complete search history.

(56) References Cited

U.S. PATENT DOCUMENTS

| 10,516,084 | B2 | 12/2019 | Sasaki et al. | |
| 11,362,072 | B2 * | 6/2022 | Qiang | H01L 33/20 |
| 2016/0380158 | A1 * | 12/2016 | Sasaki | H01L 25/50 |
| | | | | 257/89 |
| 2018/0197461 | A1 * | 7/2018 | Lai | H01L 25/167 |
| 2019/0006564 | A1 | 1/2019 | Sasaki et al. | |
| 2020/0203557 | A1 | 6/2020 | Park et al. | |
| 2021/0111302 | A1 * | 4/2021 | Pan | H01L 33/06 |
| 2021/0142716 | A1 | 5/2021 | Robin et al. | |

(Continued)

FOREIGN PATENT DOCUMENTS

| JP | 2019-05899 A | 1/2019 |
| JP | 2019-015899 A | 1/2019 |

(Continued)

OTHER PUBLICATIONS

US 10,587,829 B2, 03/2020, Yokogawa et al. (withdrawn)

Primary Examiner — Tracie Y Green
(74) Attorney, Agent, or Firm — Sughrue Mion, PLLC

(57) ABSTRACT

Provided is a micro-LED display, a micro-LED transferring substrate, and a method of transferring micro-LEDs using the micro-LED transferring substrate. The micro-LED includes a backplane substrate; and a plurality of sub-pixels provided on the backplane substrate, wherein at least one sub-pixel from among the plurality of sub-pixels includes a first micro-LED; and a second micro-LED different from the first micro-LED.

19 Claims, 52 Drawing Sheets

(56) References Cited

U.S. PATENT DOCUMENTS

| | | | |
|---|---|---|---|
| 2021/0151633 A1 | 5/2021 | Sasaki et al. | |
| 2022/0013400 A1 | 1/2022 | Hwang et al. | |
| 2022/0051924 A1 | 2/2022 | Kim et al. | |
| 2022/0077120 A1* | 3/2022 | Hong | H01L 33/62 |
| 2022/0393078 A1* | 12/2022 | Cheng | H01L 33/58 |

FOREIGN PATENT DOCUMENTS

| | | |
|---|---|---|
| KR | 10-2018-0020239 A | 2/2018 |
| KR | 10-2020-0026285 A | 3/2020 |
| KR | 10-2020-0059019 A | 5/2020 |
| KR | 10-2022-0021325 A | 2/2022 |
| KR | 10-2022-0031364 A | 3/2022 |

\* cited by examiner

MICRO-LED DISPLAYS, MICRO-LED TRANSFERRING SUBSTRATES, AND METHODS OF TRANSFERRING MICRO-LEDS USING THE MICRO-LED TRANSFERRING SUBSTRATES

CROSS-REFERENCE TO RELATED APPLICATION

This application is based on and claims priority under 35 U.S.C. § 119 to Korean Patent Application Nos. 10-2020-0130410, filed on Oct. 8, 2020 and 10-2021-0042223, filed on Mar. 31, 2021 in the Korean Intellectual Property Office, the disclosure of which is incorporated by reference herein in its entirety.

BACKGROUND

1. Field

The disclosure relates to displays, and more particularly, to micro light-emitting diode (micro-LED) displays, micro-LED transferring substrates, and methods of transferring micro-LEDs using the micro-LED transferring substrates.

2. Description of Related Art

Micro-LED displays are manufactured by arranging hundreds of thousands of LEDs having a size of, for example, 100 μm or less, on a substrate. Each micro-LED functions as a sub-pixel of a display, and thus, micro-LED displays may have higher efficiency, higher definition, and higher resolution characteristics compared to LCD or OLED displays.

A manufacturing process of a micro-LED display includes a micro-LED chip transfer process. Since the transfer yield may vary depending on a transfer process and may lead to an increase in cost, various methods have been developed to perform the transfer process at low cost and with high yield. One of the methods introduced in this regard is a wet transfer method.

SUMMARY

One or more example embodiment provide micro-LEDs providing a relatively bright and clear image due to increased light emission efficiency.

One or more example embodiments also provide micro-LED transferring substrates designed with shape capable of increasing the transfer efficiency of micro-LEDs.

One or more example embodiments also provide methods of transferring micro-LEDs by using the micro-LED transferring substrates.

Additional aspects will be set forth in part in the description which follows and, in part, will be apparent from the description, or may be learned by practice of example embodiments.

In accordance with an aspect of an example embodiment, there is provided a micro-light emitting diode (LED) display including: a backplane substrate; and a plurality of sub-pixels provided on the backplane substrate, wherein at least one sub-pixel from among the plurality of sub-pixels includes a first micro-LED; and a second micro-LED different from the first micro-LED.

The first micro-LED may have a first size and a first shape and the second micro-LED may have a second size and a second shape, and the first size may be different from the second size, the first shape may be different than the second shape, or the first size and the first shape are different than the second size and the second shape, respectively.

The plurality of sub-pixels respectively include micro-LEDs configured to emit a same light.

Among the plurality of sub-pixels, a first group of sub-pixels may include micro-LEDs configured to emit a first light, a second group of sub-pixels may include micro-LEDs configured to emit a second light, and a third group of sub-pixels may include micro-LEDs configured to emit a third light, wherein wavelengths of the first light, the second light, and the third light are different from one another.

Each sub-pixel of remaining sub-pixels from among the plurality of sub-pixels, other than the at least one sub-pixel, may include one micro-LED.

Each sub-pixel of remaining sub-pixels from among the plurality of sub-pixels, other than the at least one sub-pixel, may include a plurality of micro-LEDs respectively having a same shape.

Each sub-pixel of remaining sub-pixels from among the plurality of sub-pixels, other than the at least one sub-pixel, may include a micro-LED that may have a shape that is the same or different from a shape of one of the first micro-LED and the second micro-LED.

The first micro-LED and the second micro-LED may have a polygon shape or circular shape.

One of the first micro-LED and second micro-LED may have a polygon shape or circular shape.

In accordance with an aspect of an example embodiment, there is provided a micro-LED transferring substrate including a plurality of sub-pixel regions, wherein each sub-pixel region of the sub-pixel regions includes: a first transfer region to which a first micro-LED is transferred; and a second transfer region to which a second micro-LED is transferred, the second micro-LED being different from the first micro-LED.

The second transfer region may include a plurality of transfer regions, and a size of each of the plurality of transfer regions may be less than a size of the first transfer region.

A mold may be provided around the first transfer region and the second transfer region.

A shape of the first micro-LED and a shape of the second micro-LED may be the same, and a size of the first micro-LED and a size of the second micro-LED may be different.

A shape of the first micro-LED and a shape of the second micro-LED may be different, and a size of the first micro-LED and a size of the second micro-LED may be different.

In accordance with an aspect of an example embodiment, there is provided a method of transferring micro-LEDs, the method including: transferring a first micro-light emitting diode (LED) to a plurality of sub-pixels; and transferring a second micro-LED to the plurality of sub-pixels, wherein the transferring of the first micro-LED and the transferring of the second micro-LED are sequentially performed to transfer the first micro-LED and the second micro-LED to each of at least one of the plurality of sub-pixels, and wherein a size of the second micro-LED is less than a size of the first micro-LED.

The method may further include determining whether there is a sub-pixel to which the first micro-LED is not transferred between the transferring of the first micro-LED and the transferring of the second micro-LED.

The transferring of the first micro-LED further may include: transferring the first micro-LED having a first shape; and transferring the first micro-LED having a second shape different from the first shape.

The first micro-LED may have a polygon shape or circular shape.

The second micro-LED may have a polygon shape or circular shape.

BRIEF DESCRIPTION OF THE DRAWINGS

The above and other aspects, features, and advantages of certain example embodiments will be more apparent from the following description taken in conjunction with the accompanying drawings, in which:

FIGS. 50, 51, and 52 are plan views illustrating cases in which a pentagonal micro-LED and a circular micro-LED are transferred to a subpixel included in the micro-LED display of FIG. 1.

DETAILED DESCRIPTION

Figure 1:
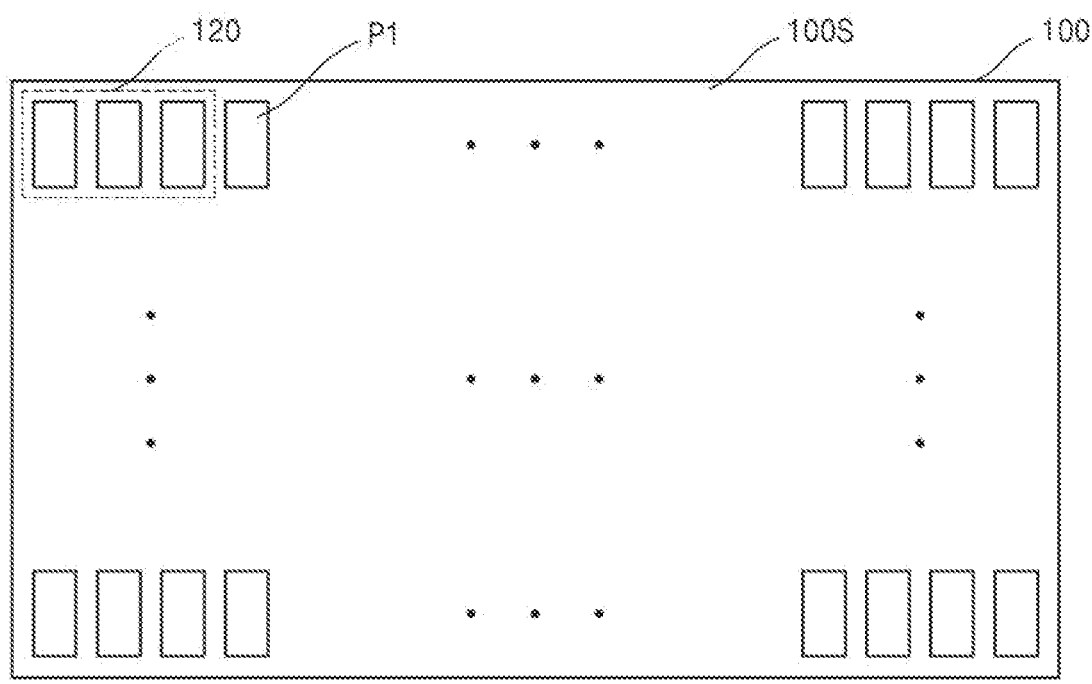
FIG. 1 is a plan view of a micro-LED display according to an example embodiment.

Reference will now be made in detail to example embodiments of which are illustrated in the accompanying drawings, wherein like reference numerals refer to like elements throughout. In this regard, example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, micro-LED displays, micro-LED transferring substrates, and micro-LED transferring methods using the micro-LED transferring substrates according to an example embodiment will be described in detail with reference to the accompanying drawings. In the drawings, thicknesses of layers and regions may be somewhat exaggerated for clarity of the specification. The following example embodiments described below are merely illustrative, and various modifications may be possible from the example embodiments of the disclosure. It will be understood that when an element or layer is referred to as being "on" or "above" another element or layer, the element or layer may be directly on another element or layer or intervening elements or layers. In the following descriptions, like reference numerals refer to like elements throughout.

A micro-LED display according to an example embodiment will be described.

FIG. 1 shows a micro-LED display 100 according to an example embodiment.

Referring to FIG. 1, the micro-LED display 100 includes a plurality of sub-pixels P1. The plurality of sub-pixels P1 are uniformly distributed over an entire pixel surface 100S. Each of the plurality of sub-pixels P1 may include a micro-LED. Here, the micro-LED may be an LED having a size of 100 μm or less. In one example, the micro-LED may be an LED having a size of 95 μm or less, and in another example, may be an LED of 90 μm or less, an LED of 80 μm or less, or an LED of 70 μm or less. The size of an LED may be a diameter in a given direction when a normally mounted micro-LED is viewed in a plan view. In one example, the given direction may be a transverse direction or a longitudinal direction, and in another example, may be a diameter having the largest diameter in a plane. The pixel surface 100s may be a surface on which an image is generated by driving control of the plurality of sub-pixels P1 included in the micro-LED display 100. A pixel 120 may include three sub-pixels. In another example, the pixel 120 may include three or more sub-pixels. In one example, all of the plurality of sub-pixels P1 may emit the same first light (e.g., blue light B). In another example, a first group of the plurality of sub-pixels P1 may emit the first light, a second group of the plurality of sub-pixels P1 may emit second light (e.g., red light R), and the third group of the plurality of sub-pixels P1 which is the remaining plurality of sub-pixels P1 may emit third light (e.g., green light G).

Figure 2:
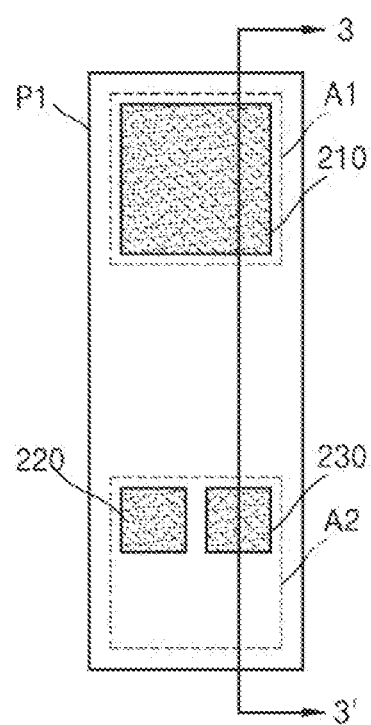
FIG. 2 is a plan view illustrating an example of a sub-pixel included in the micro-LED display of FIG. 1 according to an example embodiment.

FIG. 2 shows an example of a sub-pixel P1 included in the micro-LED display 100 of FIG. 1.

Referring to FIG. 2, one sub-pixel P1 may include a first region A1 and a second region A2 spaced apart from each other. The first and second regions A1 and A2 may have the same area, but are not limited thereto. A first micro-LED 210 is disposed in the first region A1. The first micro-LED 210 may have a chip shape. Therefore, the first micro-LED 210 may be a micro-LED chip. The second and third micro- LEDs 220 and 230 are disposed in the second region A2. The second and third micro-LEDs 220 and 230 may be the same in size and light emission characteristics. For example, the sizes of the second and third micro-LEDs 220 and 230 may be the same and may emit the same light (e.g., blue light B). Each of the second and third micro-LEDs 220 and 230 may also be provided in a chip shape. The size of each of the second and third micro-LEDs 220 and 230 may be less than that of the first micro-LED 210. The light emission characteristics of the first micro-LED 210 may be the same as the light emission characteristics of the second and third micro-LEDs 220 and 230. Light emitted from the first micro-LED 210 may have the same color as light emitted from the second and third micro-LEDs 220 and 230. In one example, all of the first to third micro-LEDs 210, 220, and 230 may emit blue light, green light, or red light. Accordingly, monochromatic light, such as R, G, or B may be emitted from the pixel 120, or light in which R, G, and B are mixed may be emitted.

FIG. 2 illustrates that two micro-LEDs 220 and 230 are disposed in the second region A2. However, embodiments are not limited thereto. For example, two or more, for example, three or four micro-LEDs may be disposed in the second region A2, or only one micro-LED may be disposed in the second region A2. When the first micro-LED 210 is disposed in the first region A1, a micro-LED may not be disposed in the second region A2.

In one example, instead of the second and third micro-LEDs 220 and 230, only the first micro-LED 210 may be disposed in the second region A2.

Figure 3:
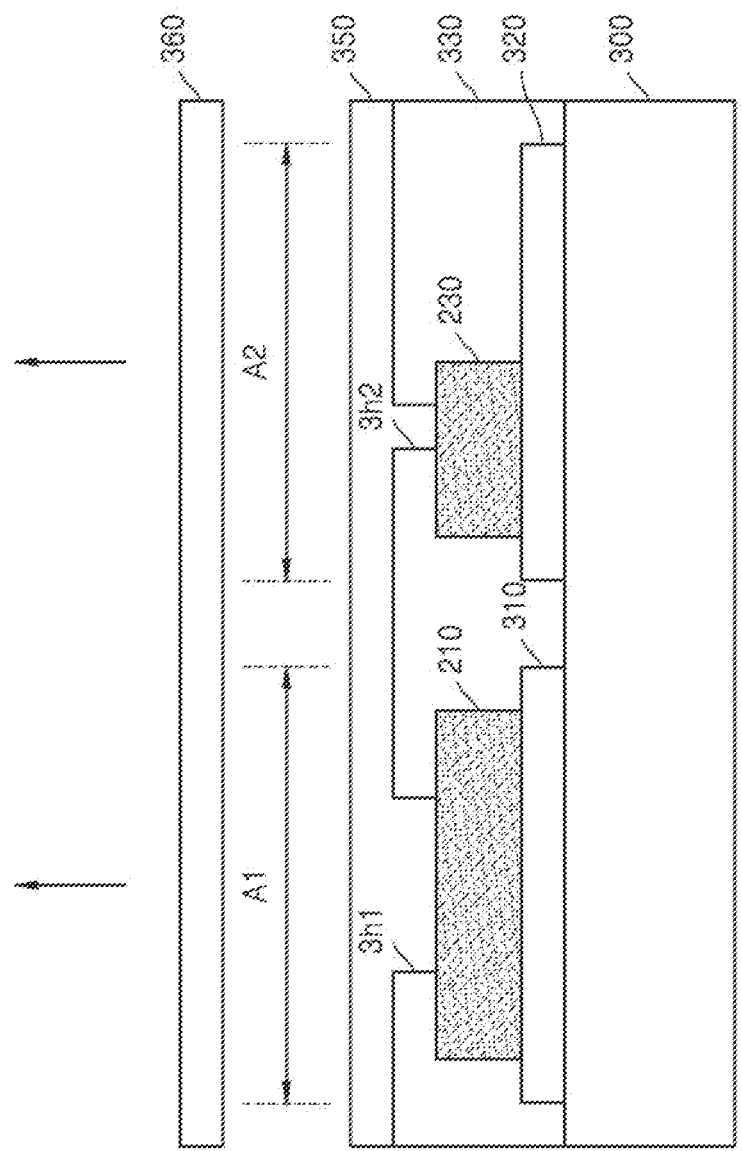
FIG. 3 is a cross-sectional view taken along a line 3-3' of FIG. 2.

FIG. 3 is a cross-sectional view taken along a line 3-3' of FIG. 2.

Referring to FIG. 3, first and second electrodes 310 and 320 are provided on a backplane substrate 300. The backplane substrate 300 may include a circuit unit including a driving element that takes part in operation and control of a micro-LED, such as a transistor (e.g., a thin film transistor (TFT)). The first and second electrodes 310 and 320 may be disposed to be spaced apart from each other. In one example, the first and second electrodes 310 and 320 may be lower electrodes. The first micro-LED 210 is disposed on the first electrode 310. The third micro-LED 230 is disposed on the second electrode 320. The first electrode 310 may contact an electrode (P-type or N-type electrode) formed on a first side of the first micro-LED 210. The second electrode 320 may contact an electrode (P-type electrode or N-type electrode) formed on the first side of the third micro-LED 230. The first and second electrodes 310 and 320 and the first and third micro-LEDs 210 and 230 are covered with an insulating layer 330. The insulating layer 330 may include an insulating material transparent to light. An upper surface of the insulating layer 330 is flat, and the insulating layer 330 includes first and second via holes 3$h$1 and 3$h$2. A part of the first micro-LED 210 is exposed through the first via hole 3$h$1, and a part of the third micro-LED 230 is exposed through the second via hole 3$h$2. A part of an electrode provided on a second side different from the first side of the first micro-LED 210 may be exposed through the first via hole 3$h$1. A part of an electrode provided on a second side different from the first side of the third micro-LED 230 may be exposed through the second via hole 3$h$2.

A third electrode 350 that fills the first and second via holes 3$h$1 and 3$h$2 is formed on the insulating layer 330. The third electrode 350 may be used as an upper electrode. The third electrode 350 may be a common electrode. The third electrode 350 may extend to adjacent subpixels. The first to third electrodes 310, 320, and 350 may be electrodes transparent to light. A transparent plate 360 may be provided on the third electrode 350. The transparent plate 360 may be used as a protective layer. Members that may be useful for image realization may further be provided between the third electrode 350 and the transparent plate 360.

Next, various examples of the sub-pixel P1 included in the micro-LED display 100 of FIG. 1 will further be described with reference to FIGS. 4 to 14.

Figure 4:
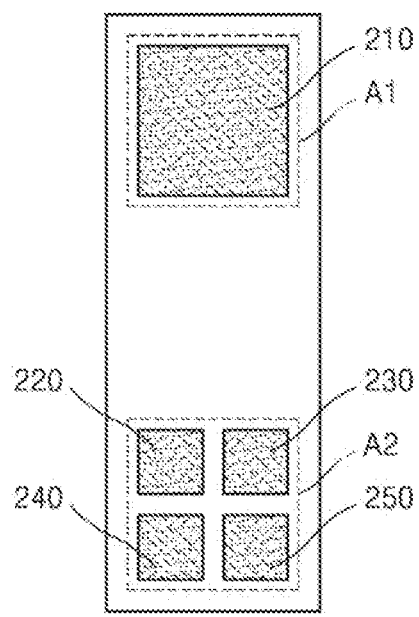
FIGS. 4, 5, 6, 7, 8, 9, 10, 11, 12, 13, and 14 are plan views illustrating various examples of subpixels included in the micro-LED display of FIG. 1 according to example embodiments.

Referring to FIG. 4, the sub-pixel P1 may include the first micro-LED 210 having a square shape in a plan view in the first region A1, and four micro-LEDs 220, 230, 240, and 250 having square shapes in the second region A2. Each of the four micro-LEDs 220, 230, 240 and 250 has a size less than that of the first micro-LED 210.

Figure 5:
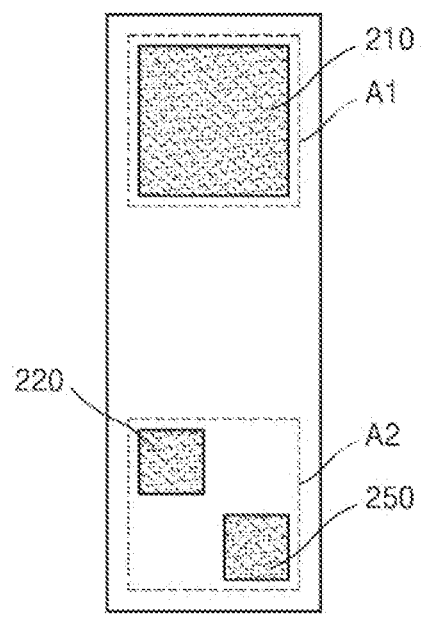

Referring to FIG. 5, the sub-pixel P1 includes the first micro-LED 210 in the first region A1 having a square shape and the two micro-LEDs 220 and 250 having square shapes in the second region A2. In the second region A2, the two micro-LEDs 220 and 250 are disposed in a diagonal direction.

Figure 6:
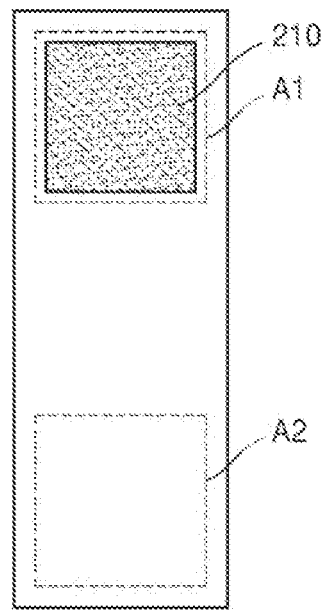

Referring to FIG. 6, the sub-pixel P1 includes the first micro-LED 210 having a square shape only in the first region A1 and does not include a micro-LED in the second region A2.

Figure 7:
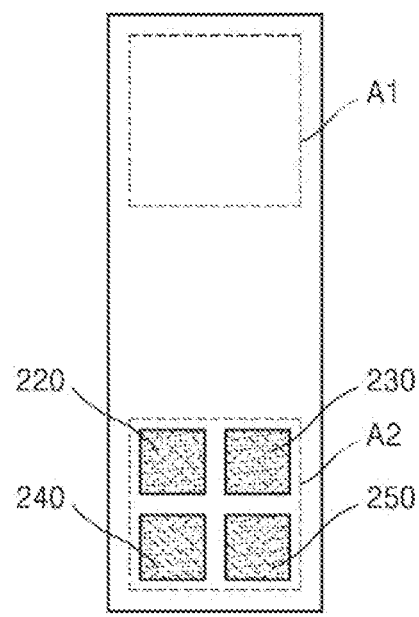

Referring to FIG. 7, the sub-pixel P1 includes the four micro-LEDs 220, 230, 240, and 250 having square shapes only in the second region A2 and does not include a micro-LED in the first region A1.

Figure 8:
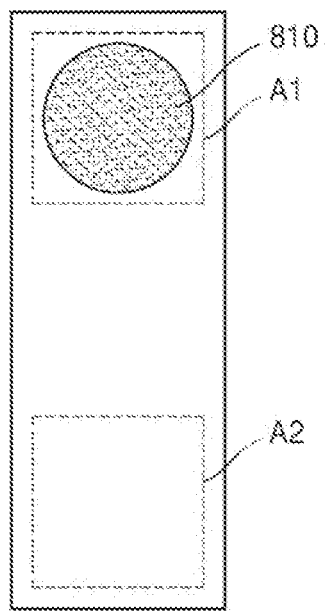

In FIG. 6, in the first region A1 of the sub-pixel P1, although the first micro-LED 210 having a rectangular shape when viewed from a plan view is disposed, but in the first region A1, as shown in FIG. 8, a sixth micro-LED 810 having a circular shape as viewed from a plan view may be disposed. In the sub-pixel P1 shown in FIG. 8, the second region A2 does not include a micro-LED.

Figure 9:
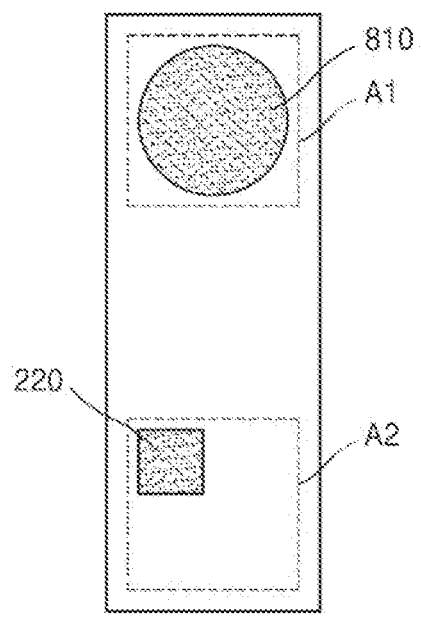

Referring to FIG. 9, the sub-pixel P1 includes the sixth micro-LED 810 having a circular shape in the first region A1 and one micro-LED 220 having a square shape and a size less than that of the sixth micro-LED 810 in the second region A2. Light emitted from the sixth micro-LED 810 may be light of the same color as light emitted from the first and second micro-LEDs 210 and 220.

Figure 10:
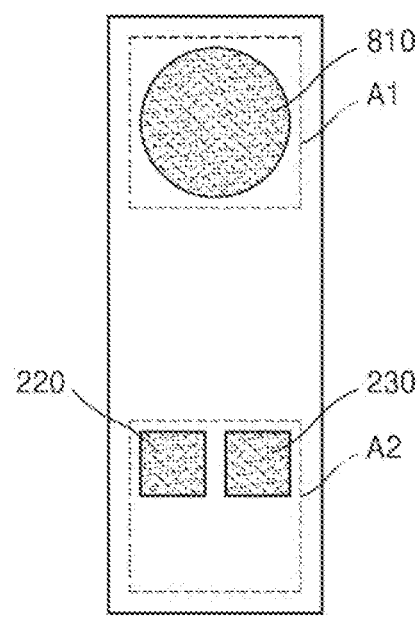

Referring to FIG. 10, the sub-pixel P1 includes the sixth micro-LED 810 having a circular shape in a first region A1 and the two micro-LEDs 220 and 230 having square shapes in the second region A2. Each of the two micro-LEDs 220 and 230 has a size less than that of the sixth micro-LED 810.

Figure 11:
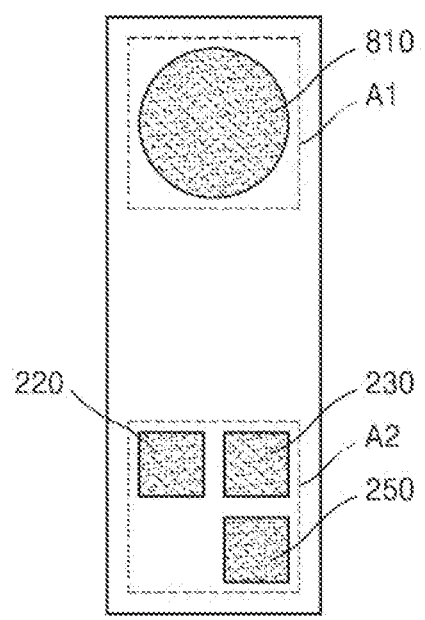

Referring to FIG. 11, the sub-pixel P1 includes the sixth micro-LED 810 having a circular shape in the first region A1 and three micro-LEDs 220, 230, and 250 having square shapes in the second region A2. The size of the fifth micro-LED 250 is less than that of the sixth micro-LED 810.

Figure 12:
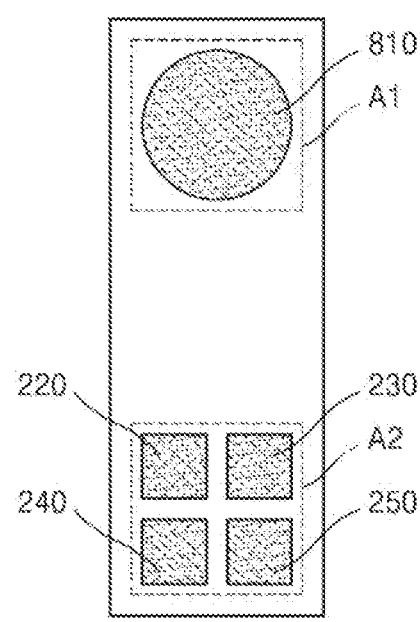

Referring to FIG. 12, the sub-pixel P1 includes the sixth micro-LED 810 having a circular shape in the first region A1, and four micro-LEDs 220, 230, 240, and 250 having square shapes in the second region A2. The size of the fourth micro-LED 240 is less than that of the sixth micro-LED 810.

Figure 13:
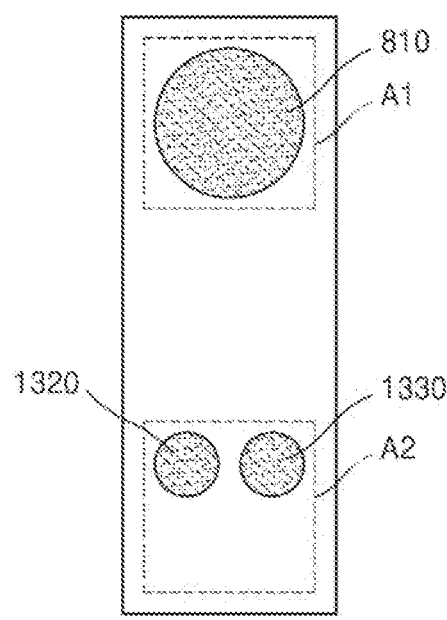

Referring to FIG. 13, the sub-pixel P1 includes the sixth micro-LED 810 having a circular shape in the first region A1 and seventh and eighth micro-LEDs 1320 and 1330 having circular shapes in the second region A2. Each of the seventh and eighth micro-LEDs 1320 and 1330 has a size less than that of the sixth micro-LED 810.

Figure 14:
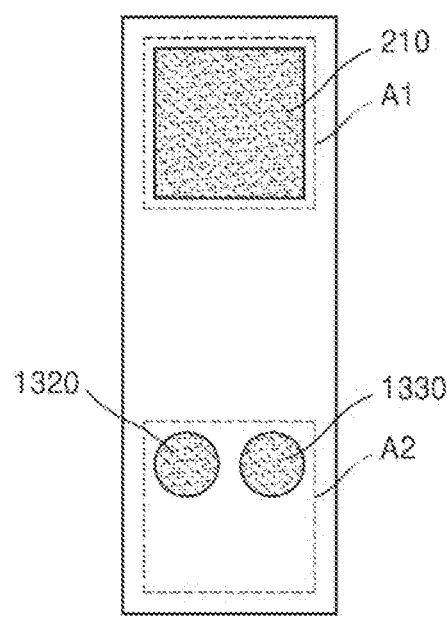

Referring to FIG. 14, the sub-pixel P1 includes the first micro-LED 210 having square shapes in the first region A1 and seventh and eighth micro-LEDs 1320 and 1330 having circular shapes in the second region A2. Each of the seventh and eighth micro-LEDs 1320 and 1330 has a size less than that of the first micro-LED 210.

Next, a transferring substrate used for transferring a micro-LED will be described with respect to example embodiments.

Figure 15:
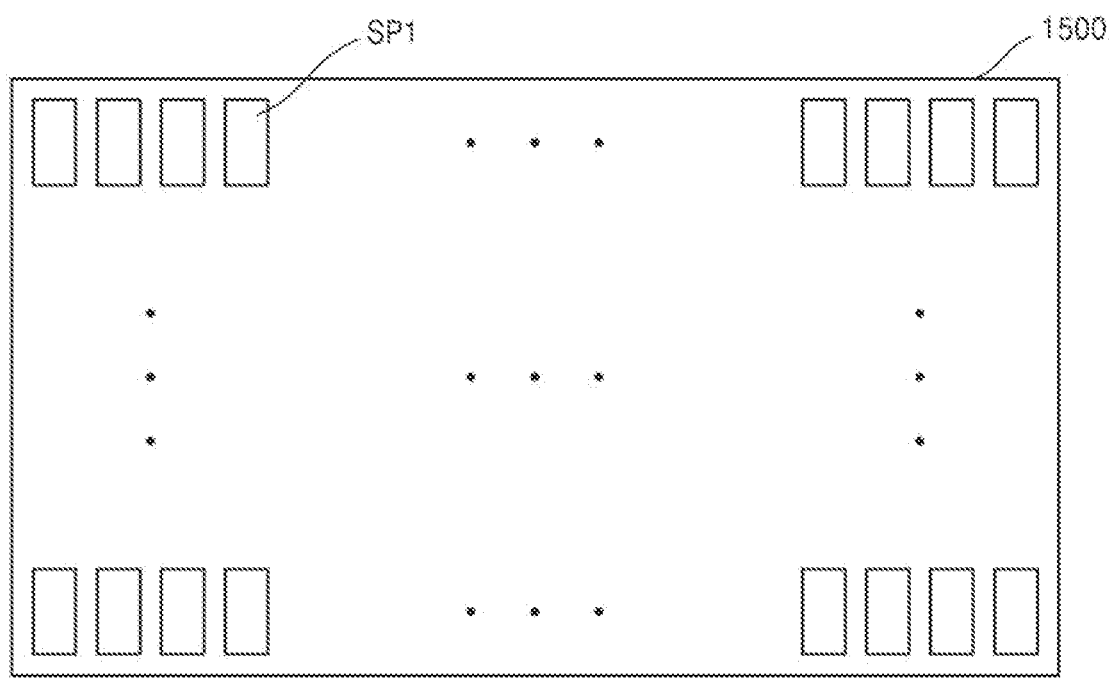
FIG. 15 is a plan view of a micro-LED transferring substrate according to an example embodiment.

FIG. 15 shows a micro-LED transferring substrate 1500 according to an example embodiment.

Referring to FIG. 15, the micro-LED transferring substrate 1500 includes a plurality of sub-pixel regions SP1. The micro-LED transferring substrate 1500 may be, for example, a glass substrate. A surface of the micro-LED transferring substrate 1500 including the plurality of sub-pixel regions SP1 may correspond to the pixel surface 100S of FIG. 1. The arrangement of the plurality of sub-pixel regions SP1 may be the same as the arrangement of the plurality of sub-pixels P1 of FIG. 1. Accordingly, one sub-pixel region SP1 may correspond to the sub-pixel P1 of FIG. 1.

Various examples of the sub-pixel region SP1 of the micro-LED transferring substrate 1500 of FIG. 15 will be described with reference to FIGS. 16 to 20.

Figure 16:
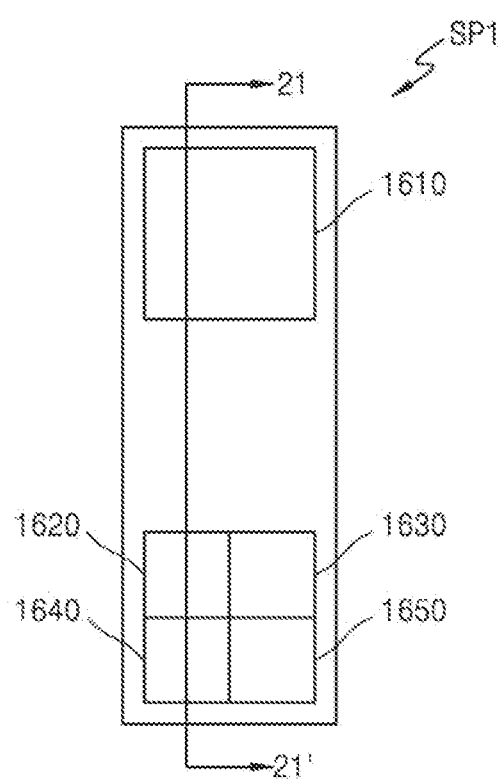
FIGS. 16, 17, 18, 19, and 20 are plan views illustrating various examples of a sub-pixel region of the micro-LED transferring substrate of FIG. 15 according to an example embodiment.

Referring to FIG. 16, the sub-pixel region SP1 includes a first transfer region 1610 and second to fifth transfer regions 1620, 1630, 1640, and 1650. The first transfer region 1610 is separated from the second to fifth transfer regions 1620, 1630, 1640, and 1650. The first transfer region 1610 may be a region where the first micro-LED 210 or the sixth micro-LED 810 is transferred, but in a secondary transfer, a micro-LED having a size less than that of the first micro-LED 210 or the sixth micro-LED 810 may be transferred. The second to fifth transfer regions 1620, 1630, 1640, and 1650 may be regions where micro-LEDs having a size less than that of the first or sixth micro-LEDs 210 and 810, for example, the second to fifth micro-LEDs 220, 230, 240, 250 are transferred. The size (width) of each of the second to fifth transfer regions 1620, 1630, 1640, and 1650 is less than that of the first transfer region 1610. The size (width) of the first transfer region 1610 may be the same as the sum of the sizes of the second to fifth transfer regions 1620, 1630, 1640, and 1650. The second to fifth transfer regions 1620, 1630, 1640, and 1650 are adjacent to each other. The first transfer region 1610 may have a quadrangle, for example, a square. The entire region including the second to fifth transfer regions 1620, 1630, 1640, and 1650 may be a quadrangle shape, and each of the second to fifth transfer regions 1620, 1630, 1640, and 1650 may be a quadrangle shape, for example, a square shape.

Figure 17:
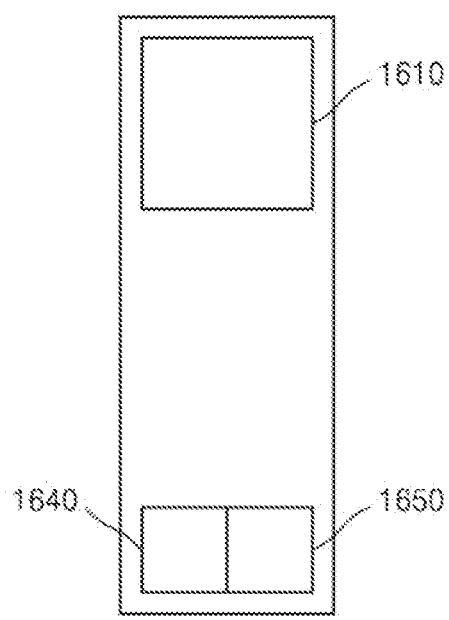

Referring to FIG. 17, the sub-pixel region SP1 includes only the first transfer region 1610 and the fourth and fifth transfer regions 1640 and 1650.

Figure 18:
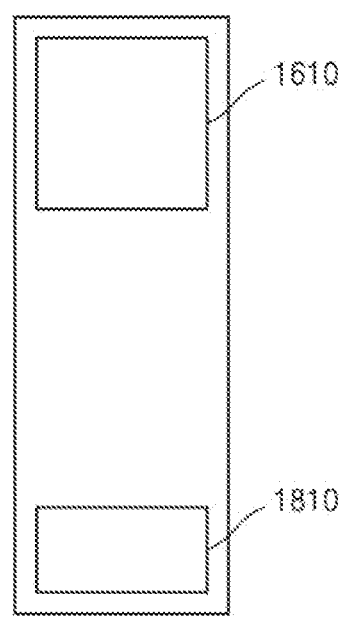

Referring to FIG. 18, the sub-pixel region SP1 includes a first transfer region 1610 and one sixth transfer region 1810. The size (area) of the sixth transfer region 1810 is less than that of the first transfer region 1610. The size of the sixth transfer region 1810 may be the same as the sum of two of the second to fifth transfer regions 1620, 1630, 1640, and 1650.

Figure 19:
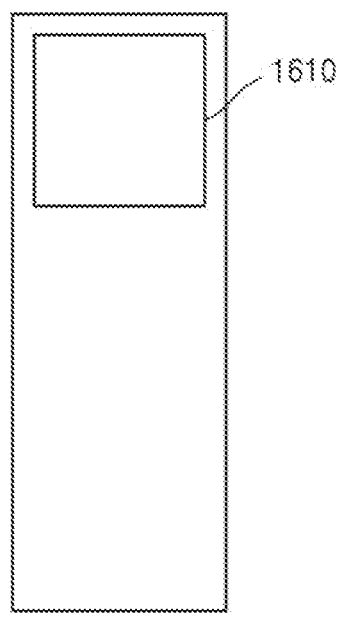

Referring to FIG. 19, the sub-pixel region SP1 includes only the first transfer region 1610 and does not include other transfer regions.

Figure 20:
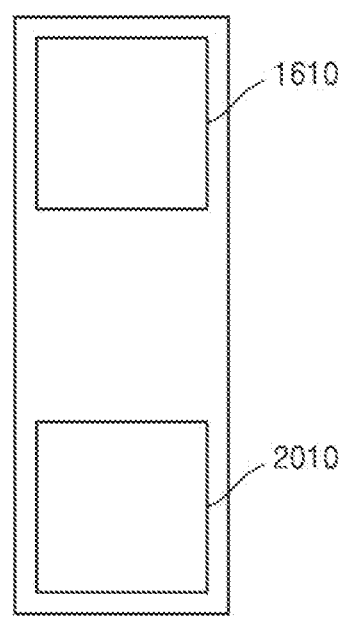

Referring to FIG. 20, the sub-pixel region SP1 includes the first transfer region 1610 and a seventh transfer region 2010. The first and seventh transfer regions 1610 and 2010 are separated from each other and may have the same size.

Figure 21:
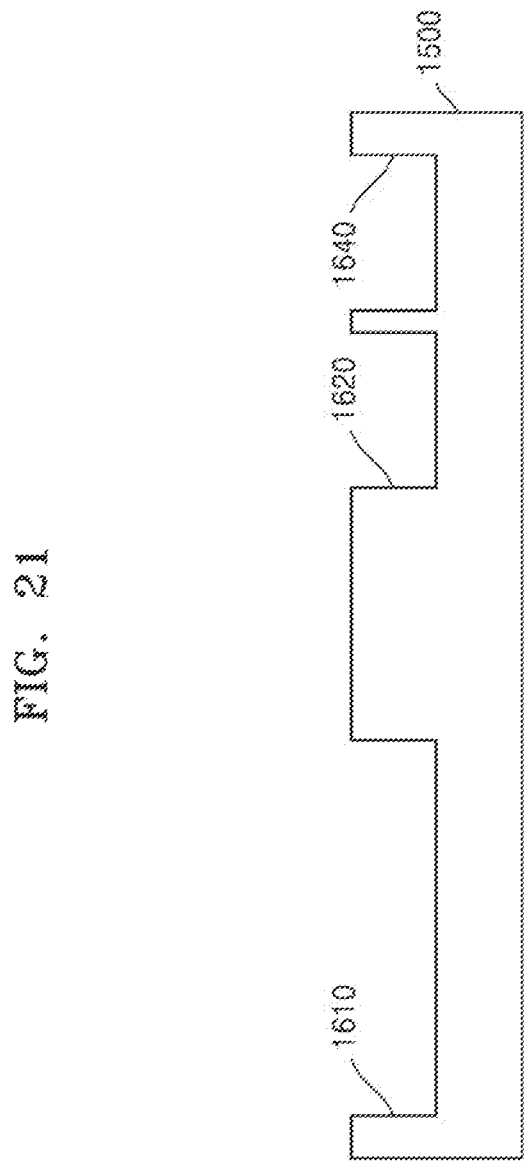
FIG. 21 is a cross-sectional view taken along a line 21-21' of FIG. 16.

FIG. 21 is a cross-sectional view taken along a line 21-21' of FIG. 16.

Referring to FIG. 21, it may be seen that the first transfer region, the second transfer region and the fourth transfer region 1610, 1620 and 1640 are recess regions formed in the micro-LED transferring substrate 1500. In the micro-LED transferring substrate 1500, the first, second, and fourth transfer regions 1610, 1620, and 1640 may be formed to have the same depth.

Figure 22:
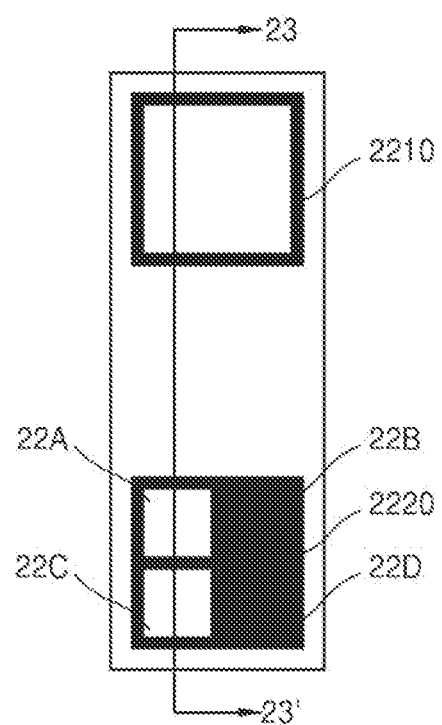
FIG. 22 is a plan view illustrating another example of a sub-pixel region of the micro-LED transferring substrate of FIG. 15 according to an example embodiment.

FIG. 22 shows another example of the sub-pixel region SP1 of the micro-LED transferring substrate 1500 of FIG. 15.

Referring to FIG. 22, the sub-pixel region SP1 includes a first mold 2210 and a second mold 2220 separated from each other. The second mold 2220 includes first to fourth regions 22A, 22B, 22C, and 22D defined by a mold. The first to fourth regions 22A, 22B, 22C, and 22D may correspond to the second to fourth transfer regions 1620, 1630, 1640, and 1650 of FIG. 16.

The shape of the first mold 2210 and the shape of the second mold 2220 are not limited to a square shape, and may be modified according to the shape of the transferred micro-LED. For example, when the shape of the transferred micro-LED is a non-circular shape or a polygonal shape, such as a triangular shape, pentagonal shape, hexagonal shape etc., the shapes of the first and second molds 2210 and 2220 may be modified according to the shape of the transferred micro-LED.

Figure 23:
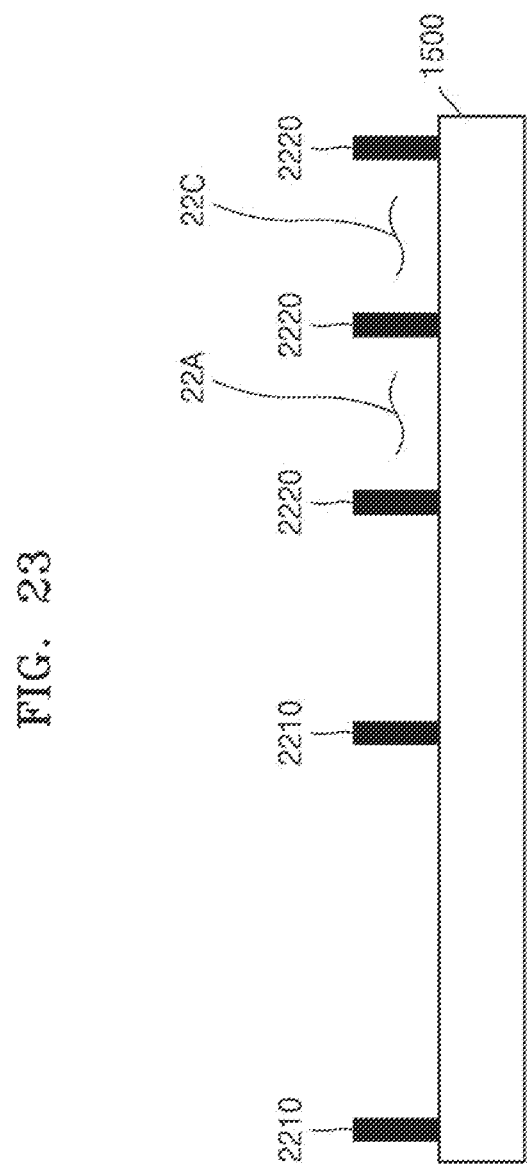
FIG. 23 is a cross-sectional view taken along a line 23-23' of FIG. 22.

FIG. 23 shows a cross-sectional view taken along a line 23-23' of FIG. 22.

Referring to FIG. 23, first and second molds 2210 and 2220 are provided on an upper surface of the micro-LED transferring substrate 1500. The first and second molds 2210 and 2220 may have the same height.

Next, a method of transferring a micro-LED according to example embodiments will be described with reference to FIGS. 24 to 43.

The micro-LED transferring substrate 1500 of FIG. 15 includes a plurality of sub-pixel regions SP1, and the number of sub-pixel regions SP1 may be several million or more. However, for convenience of explanation, only five sub-pixel regions SP1 are used in the following description of the method of transferring a micro-LED. Since the plurality of sub-pixel regions SP1 are generally equal, the following description of the method of transferring a micro-LED may be applied to the plurality of sub-pixel regions SP1 as well.

Figure 24:
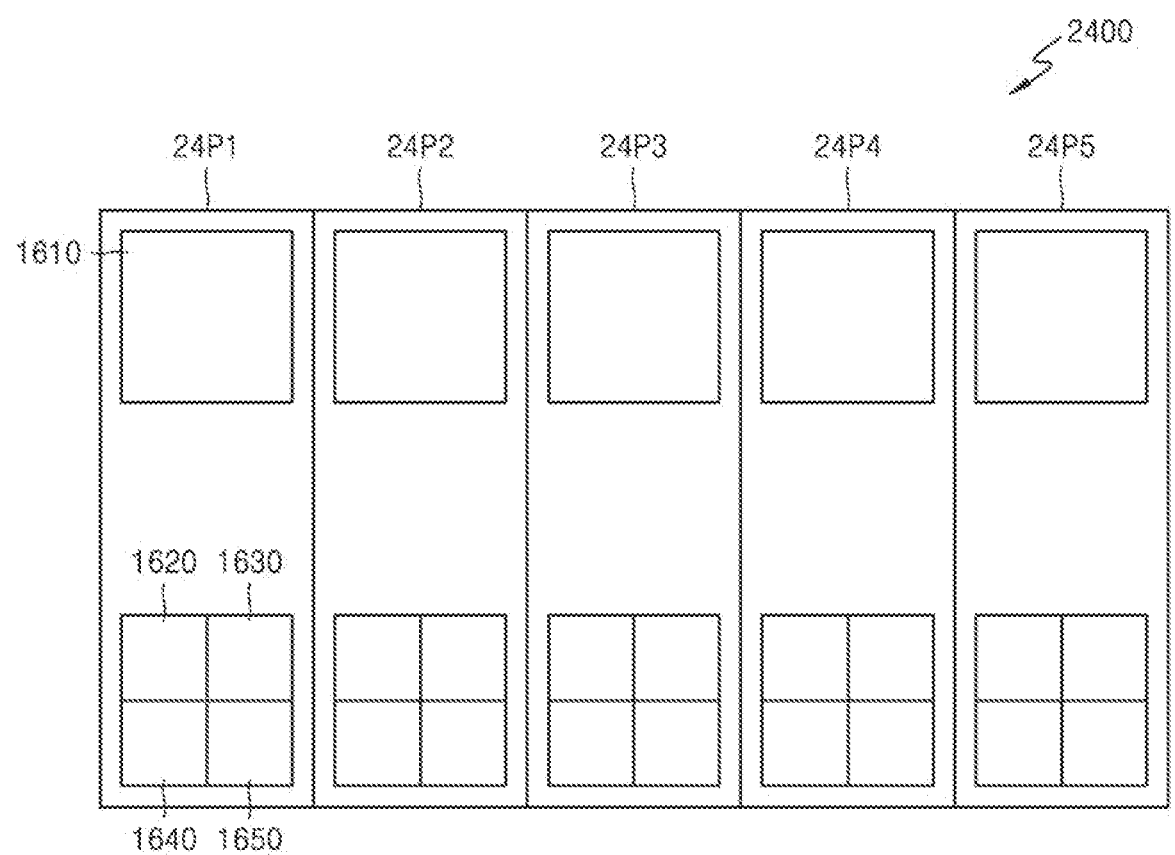
FIGS. 24, 25, 26, 27, 28, 29, 30, 31, 32, 33, 34, 35, 36, 37, 38, 39, 40, 41, 42, and 43 are plan views showing a method of transferring a micro-LED step by step according to an example embodiment.

First to fifth sub-pixel regions 24P1, 24P2, 24P3, 24P4, and 24P5 shown in FIG. 24 are based on the sub-pixel regions SP1 shown in FIG. 16. However, each of the first to fifth sub-pixel regions 24P1, 24P2, 24P3, 24P4, and 24P5 may be replaced with the sub-pixel regions SP1 shown in FIGS. 17 to 20 and 22.

A first transfer of micro-LEDs is performed on a transferring substrate 2400 shown in FIG. 24. The first transfer may be performed by using a wet transfer method in which a liquid including a plurality of micro-LEDs flows onto the transferring substrate 2400. In the first transfer, relatively large micro-LEDs are transferred.

Figure 25:
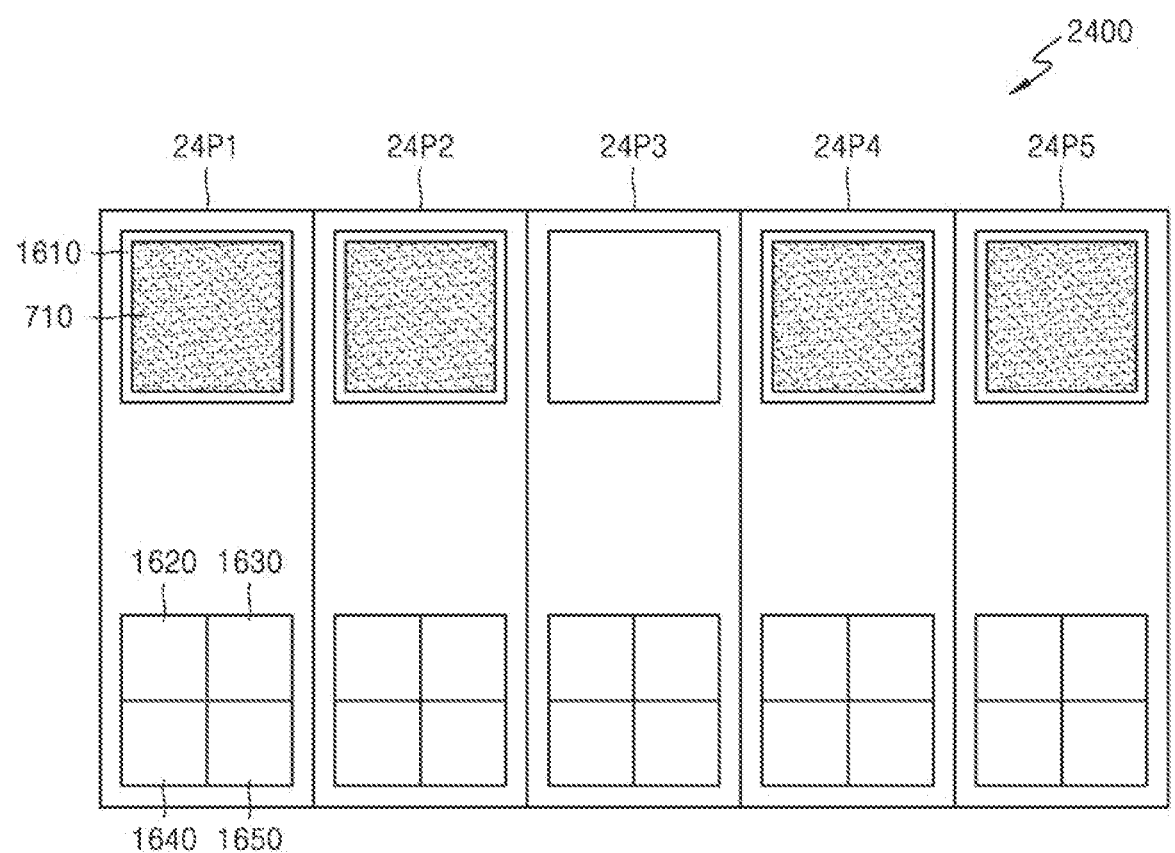

FIG. 25 shows an example of a result after the first transfer is completed.

Referring to FIG. 25, a ninth micro-LED 710 having a square shape is transferred in the first transfer region 1610 of the first and second sub-pixel regions 24P1 and 24P2 and the fourth and fifth sub-pixel regions 24P4 and 24P5. In one example, the ninth micro-LED 710 may be the first micro-LED 210.

The first transfer region 1610 of the third sub-pixel region 24P3 remains as an untransferred region. The size of each of the second to fifth transfer regions 1620, 1630, 1640, 1650 of the first to fifth sub-pixel regions 24P1 to 24P5 is less than the size of the ninth micro-LED 710. Therefore, the ninth micro-LED 710 is not transferred to the second to fifth transfer regions 1620, 1630, 1640, and 1650. That is, in the first transfer, the micro-LED may be selectively transferred only to the first transfer region 1610.

Next, a second transfer of a micro-LED transfer is performed on the transferring substrate 2400 of FIG. 25. The second transfer may be performed by using a wet transfer method similar to the first transfer. In the second transfer, a micro-LED having a size (area) less than that of the micro-LED used in the first transfer may be used.

Figure 26:
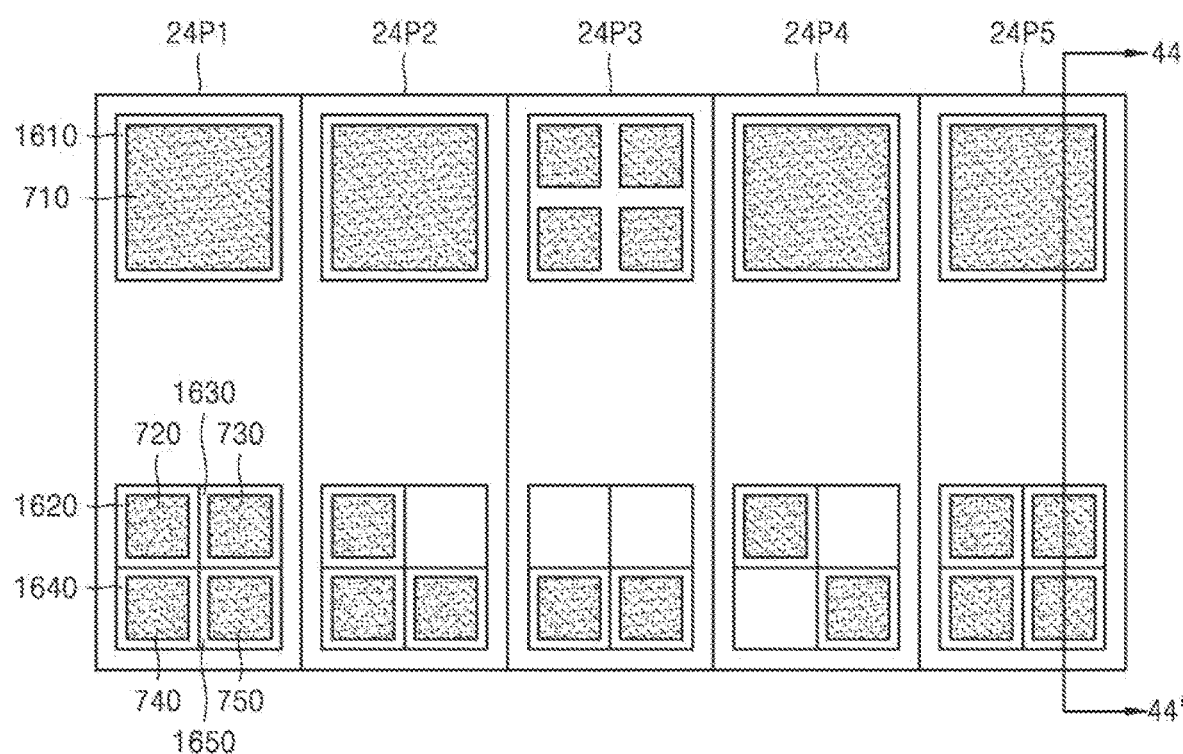

FIG. 26 shows a result after performing the second transfer.

Referring to FIG. 26, tenth to thirteenth micro-LEDs 720, 730, 740, and 750 having square shapes are transferred to the first transfer region 1610 of the third sub-pixel region 24P3, and two or four micro-LEDs 720, 730, 740, and 750 are also transferred to the second to fifth transfer regions 1620, 1630, 1640, and 1650 of the first to fifth sub-pixel regions 24P1 to 24P5. The tenth to thirteenth micro-LEDs 720, 730, 740, and 750 may correspond to the second to fifth micro-LEDs 220, 230, 240, and 250.

Since micro-LEDs having a size less than that of the micro-LEDs used in the first transfer are used in the second transfer, the untransferred regions remaining after the first transfer may be completely filled.

That is, since the sizes of the micro-LEDs used in the first and second transfer are different from each other, the transfer efficiency of the micro-LED may be increased. In other words, it is possible to obtain a repair-free transfer result due to the first and second transfer.

Figure 27:
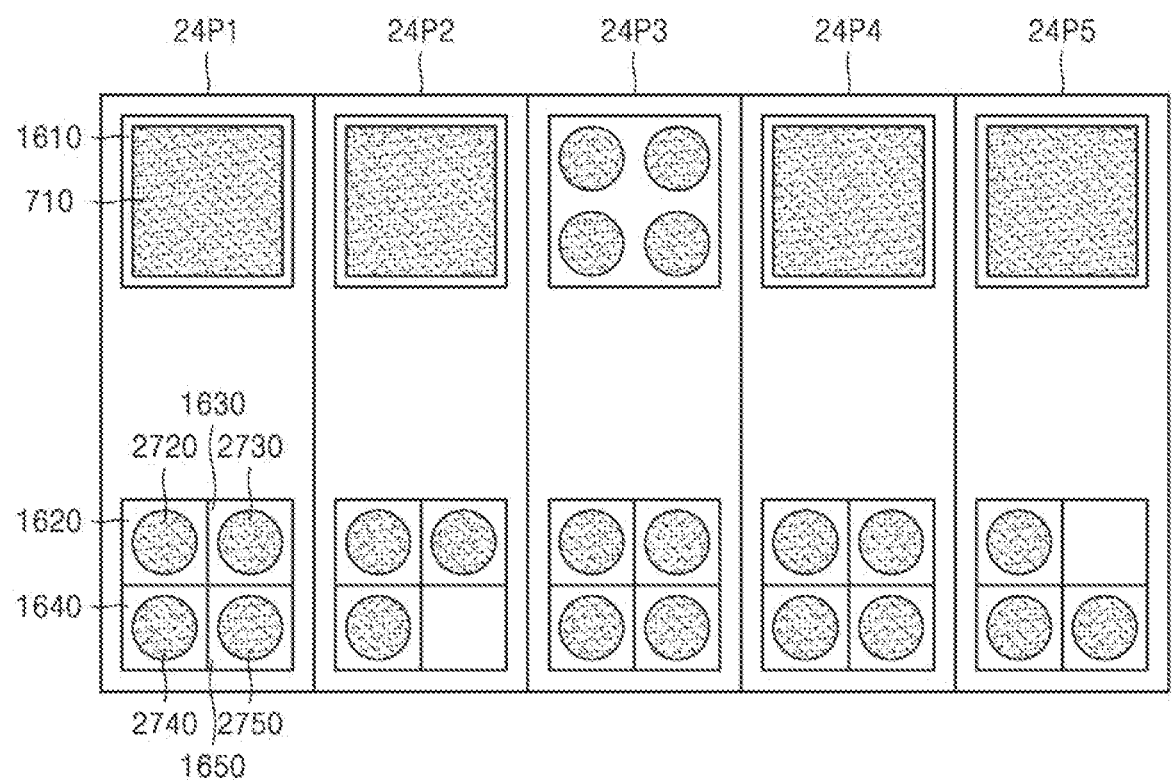

FIG. 27 shows a case in which circular micro-LEDs 2720, 2730, 2740, and 2750 are used instead of using square micro-LEDs in the second transfer. The circular micro-LEDs 2720, 2730, 2740, and 2750 may have relatively high rotational symmetry, and thus, be more easily transferred to transfer regions.

Referring to FIG. 27, fourteenth to seventeenth micro-LEDs 2720, 2730, 2740 and 2750 are transferred to the first transfer region 1610 of the third sub-pixel region 24P3, and three or four micro-LEDs 2720, 2730, 2740, and 2750 are also transferred to the second to fifth transfer regions 1620, 1630, 1640, and 1650 of the first to fifth sub-pixel regions 24P1 to 24P5. Each of the fourteenth to seventeenth micro-LEDs 2720, 2730, 2740, and 2750 may have the same shape and size as the seventh or eighth micro-LEDs 1320 and 1330.

When FIG. 26 and FIG. 27 are compared, the transfer result of FIG. 27 shows a relatively high transfer yield compared to the transfer result of FIG. 26.

Figure 28:
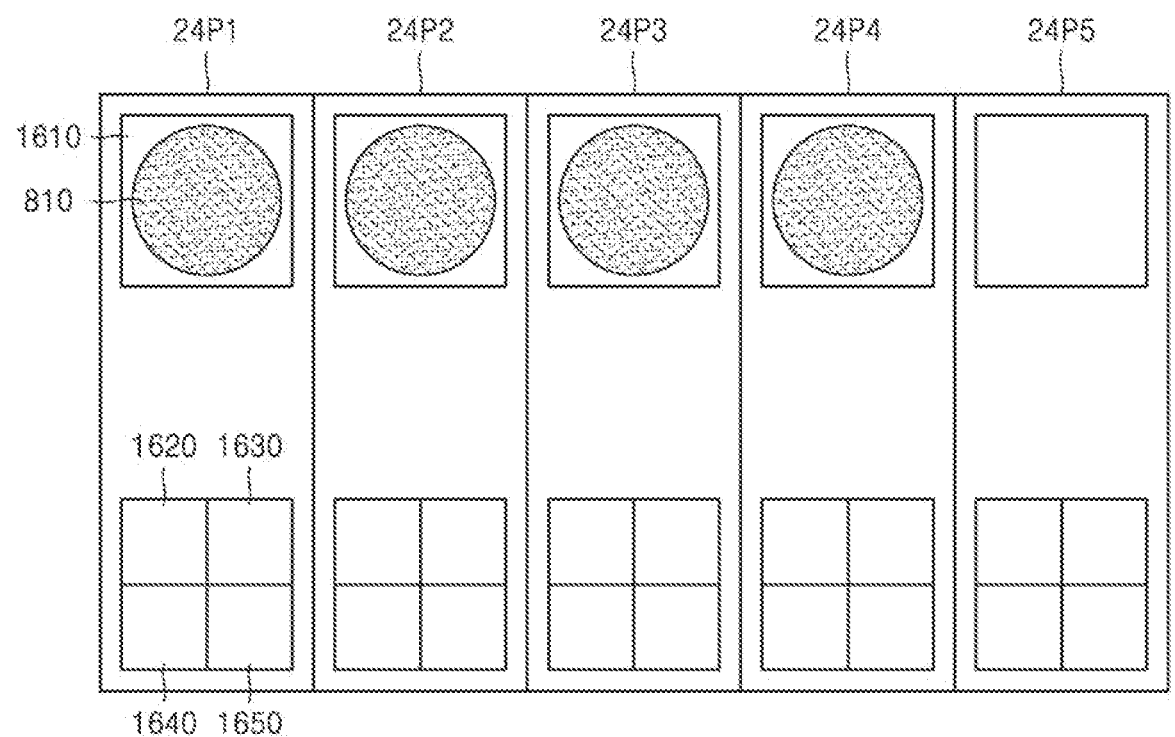

FIG. 28 shows a case in which a micro-LED 810 having a circular shape is used instead of a micro-LED having a square shape in the first transfer.

Figure 29:
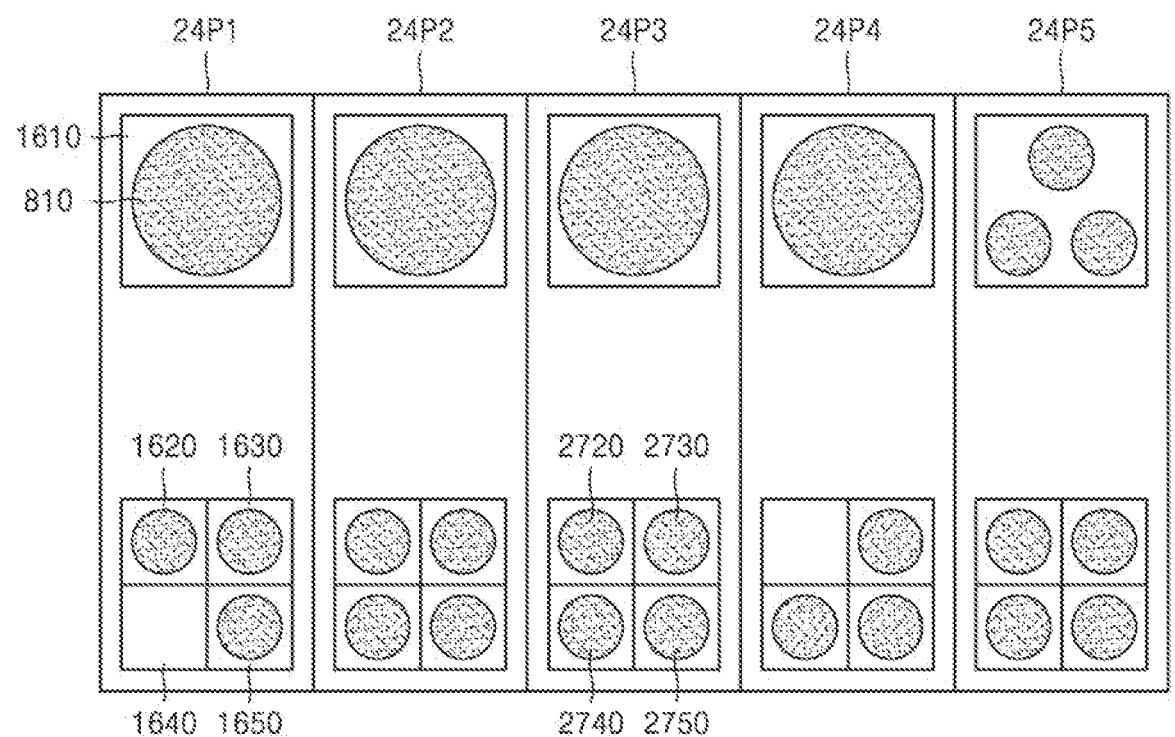

FIG. 29 shows a result of second transfer that is performed on the transferring substrate of FIG. 28 using micro-LEDs 2720, 2730, 2740, and 2750 having a circular shape and a size less than the micro-LED 810.

Referring to FIG. 29, micro-LEDs 810, 2720, 2730, 2740, and 2750 are transferred in the first transfer region 1610 and the second to fifth transfer regions 1620, 1630, 1640, 1650 of each of the first to fifth sub-pixel regions 24P1 to 24P5.

Figure 30:
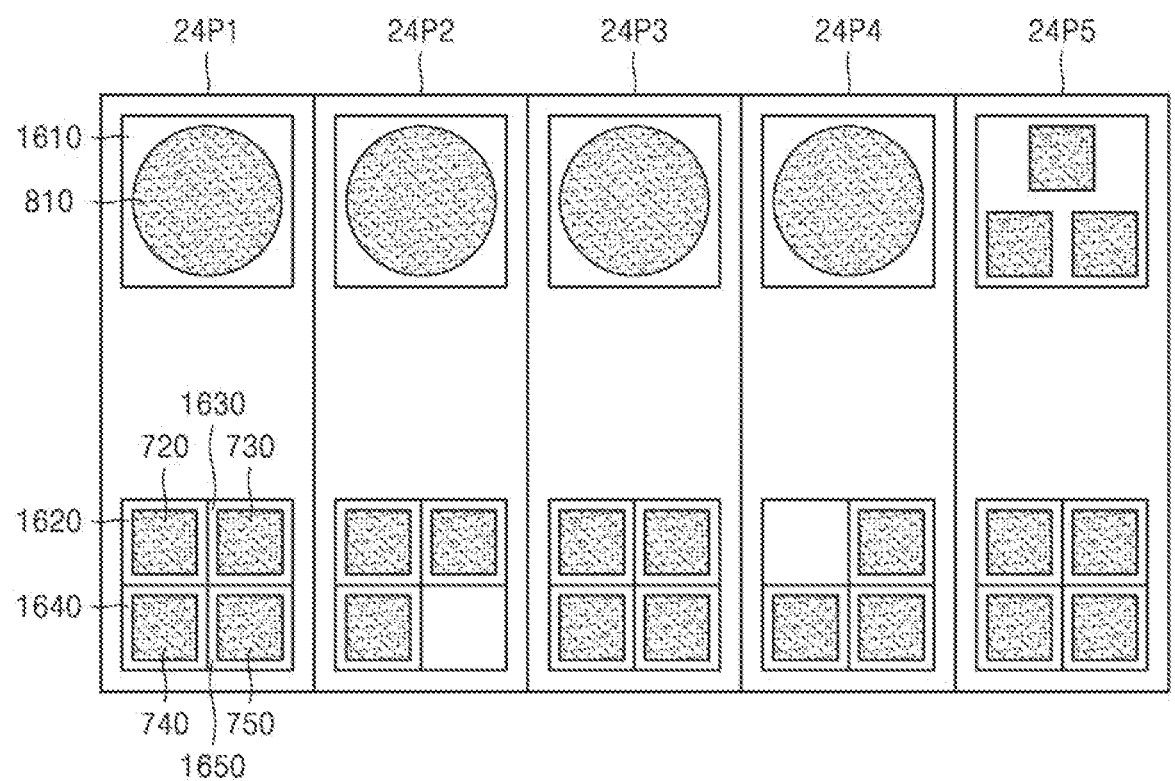

FIG. 30 shows a case in which a micro-LED having a square shape and a small size is used instead of a micro-LED having a circular shape in the second transfer of the transferring methods of FIGS. 28 and 29.

Referring to FIG. 30, micro-LEDs 810, 720, 730, 740, and 750 are transferred to all sub-pixel regions 24P1 to 24P5.

Figure 31:
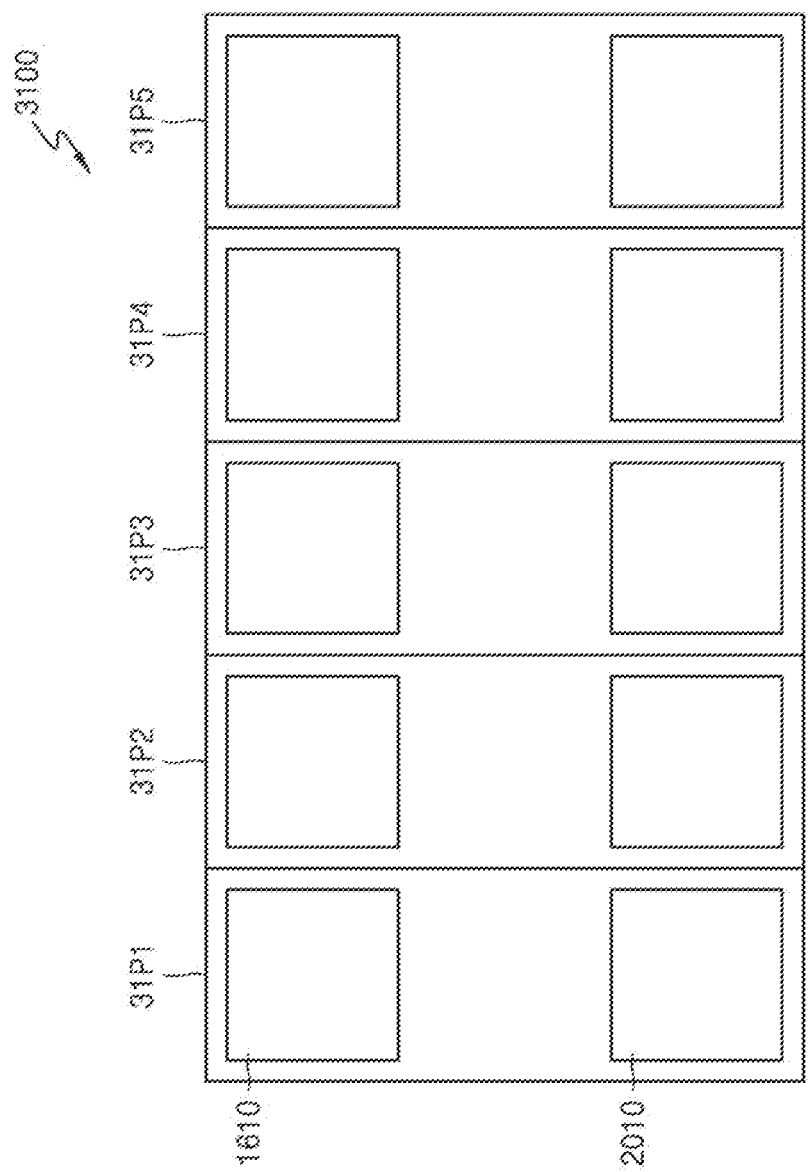

FIG. 31 shows a transferring substrate 3100 in which each of first to fifth sub-pixel regions 31P1 to 31P5 is a sub-pixel region shown in FIG. 20. Each of the first to fifth sub-pixel regions 31P1 to 31P5 includes first and seventh transfer regions 1610 and 2010 that are separated from each other.

Figure 32:
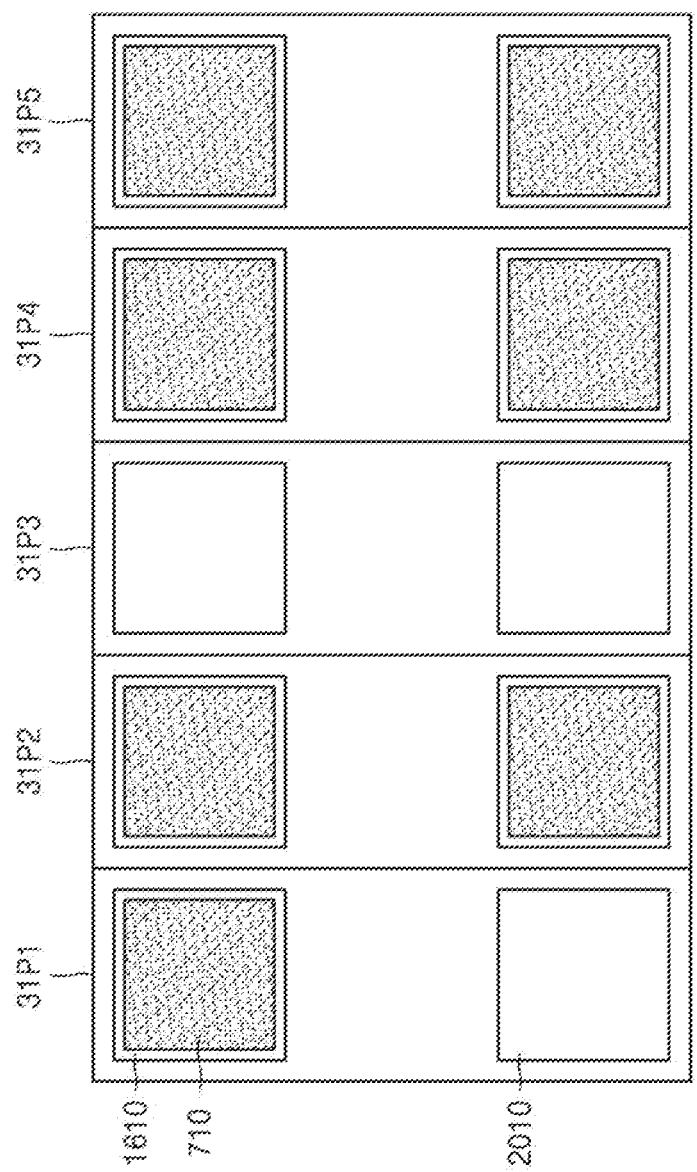
Figure 33:
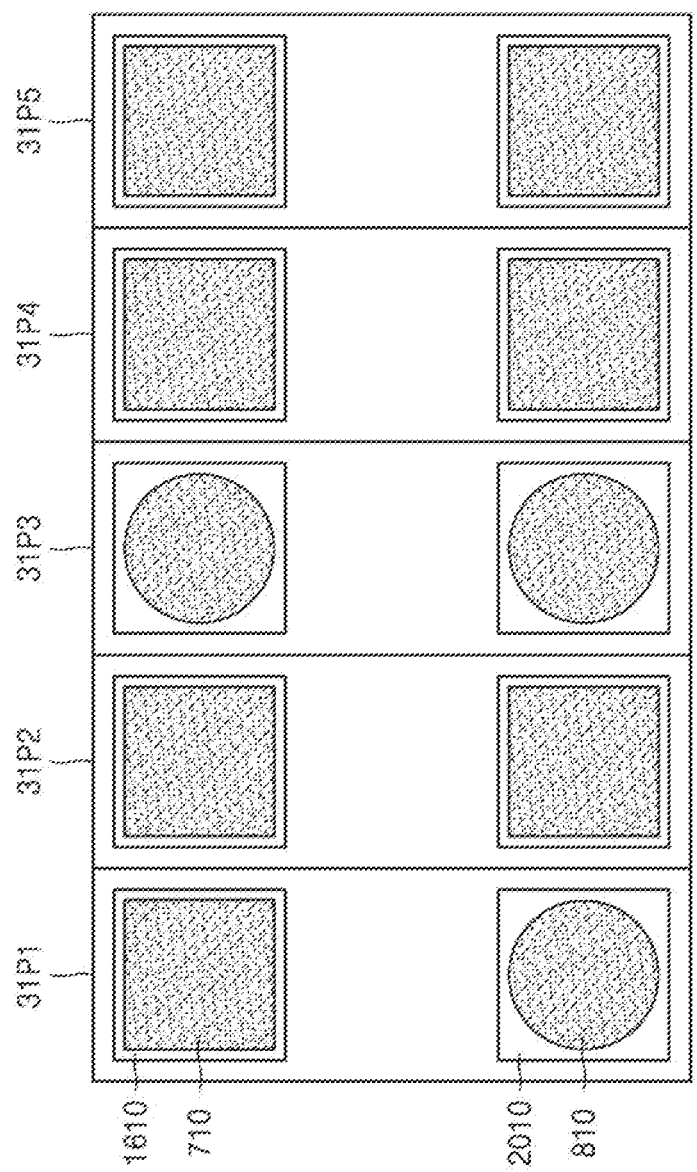

FIGS. 32 and 33 show an example of a result of performing first and second transfers on the transferring substrate 3100 of FIG. 31. The ninth micro-LED 710 is used in the first transfer, and the sixth micro-LED 810 is used in the second transfer.

Referring to FIG. 32, the ninth micro-LED 710 is transferred to the first transfer region 1610 of the first, second, fourth, and fifth sub-pixel regions 31P1, 31P2, 31P4, and 31P5 and the seventh transfer region 2010 of the second, fourth, and fifth sub-pixel regions 31P2, 31P4, and 31P5.

Referring to FIG. 33, by the second transfer, the sixth micro-LED 810 is transferred to the seventh transfer region 2010 of the first sub-pixel region 31P1 and the first and seventh transfer regions 1610 and 2010 of the third sub-pixel region 31P3, which are untransferred regions where a micro-LED is not transferred in the first transfer.

Figure 34:
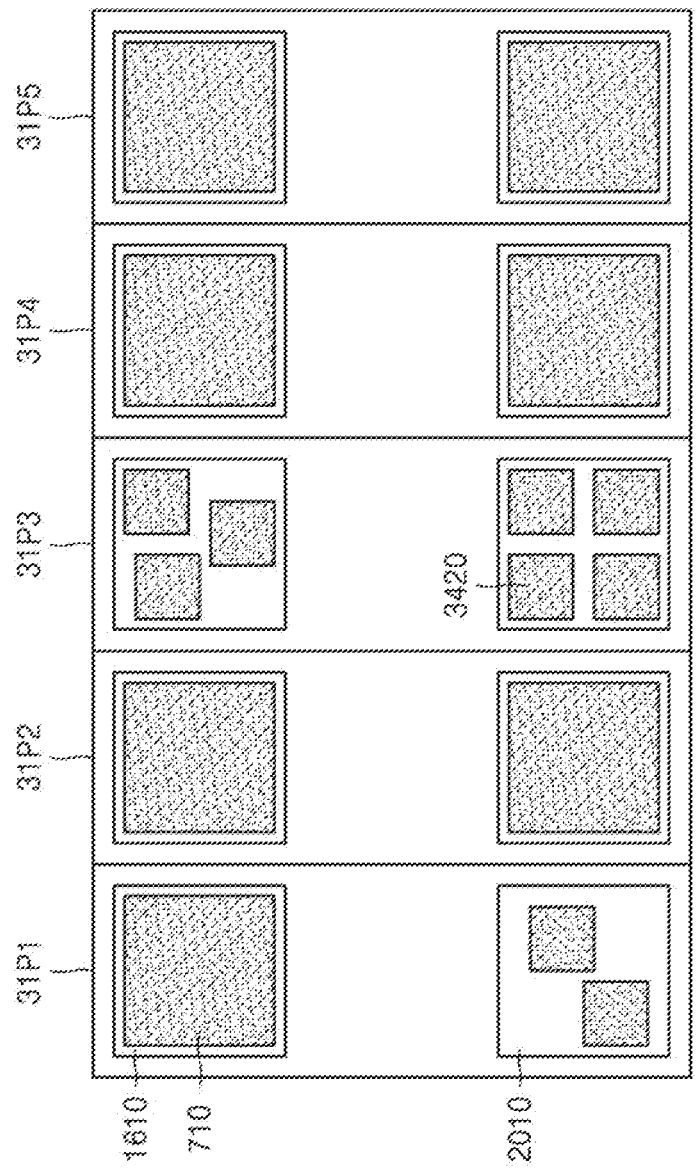

FIG. 34 shows a result when an eighteenth micro-LED 3420 having a square shape and a size less than that of the sixth micro-LED 810 is used instead of the sixth micro-LED 810 in the second transfer in the transferring method of FIGS. 32 and 33. The size and shape of the eighteenth micro-LED 3420 may be the same as the second micro-LED 220.

Referring to FIG. 34, two to four eighteenth micro-LEDs 3420 are transferred in the seventh transfer region 2010 of the first sub-pixel region 31P1 and the first and seventh transfer regions 1610 and 2010 of the third sub-pixel region 31P3, which are untransferred regions in the first transfer.

Figure 35:
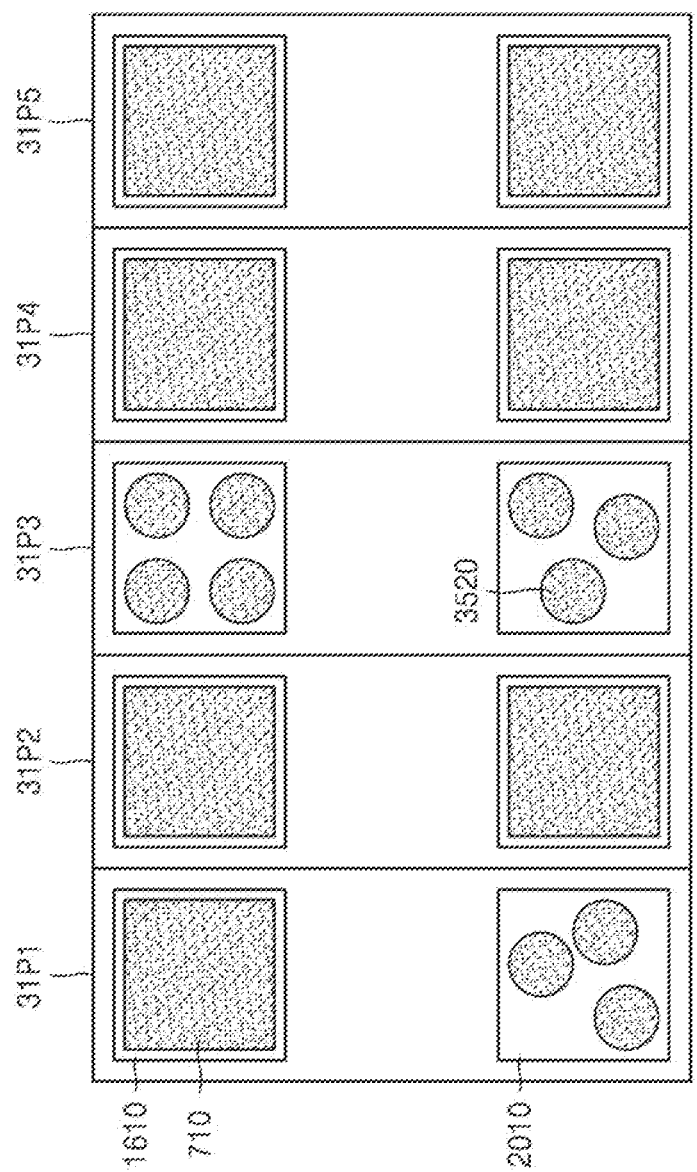

FIG. 35 shows a result when a nineteenth micro-LED 3520 having a circular shape and a size less than the sixth micro-LED 810 is used instead of the sixth micro-LED 810 in the second transfer in the transferring method of FIGS. 32 and 33. The size and shape of the nineteenth micro-LED 3520 may be the same as the seventh or eighth micro-LEDs 1320 and 1330 of FIG. 13.

Referring to FIG. 35, three to four nineteenth micro-LEDs 3520 are transferred in the seventh transfer region 2010 of the first sub-pixel region 31P1 and the first and seventh transfer regions 1610 and 2010 of the third sub-pixel regions 31P3, which are untransferred regions in the first transfer.

Figure 36:
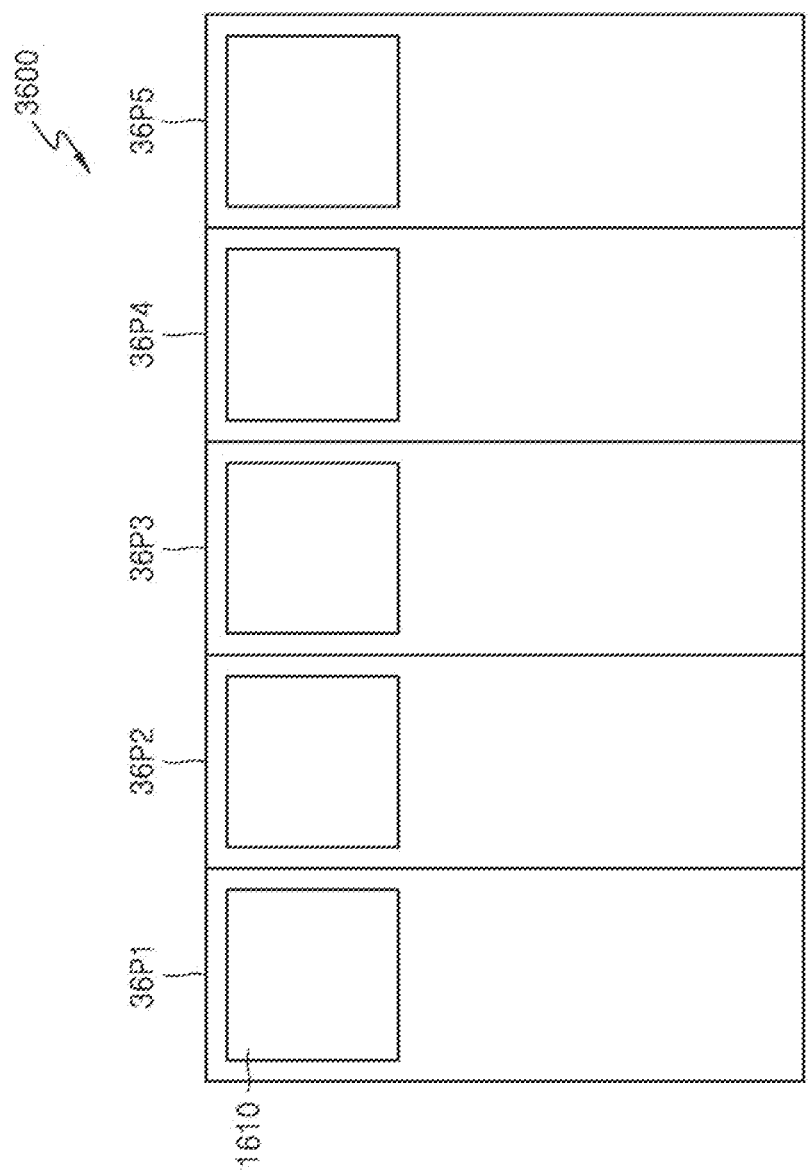

FIG. 36 shows a transferring substrate 3600 in which each of first to fifth sub-pixel regions 36P1 to 36P5 is a sub-pixel region shown in FIG. 19. Each of the first to fifth sub-pixel regions 36P1 to 36P5 includes only one first transfer region 1610.

Figure 37:
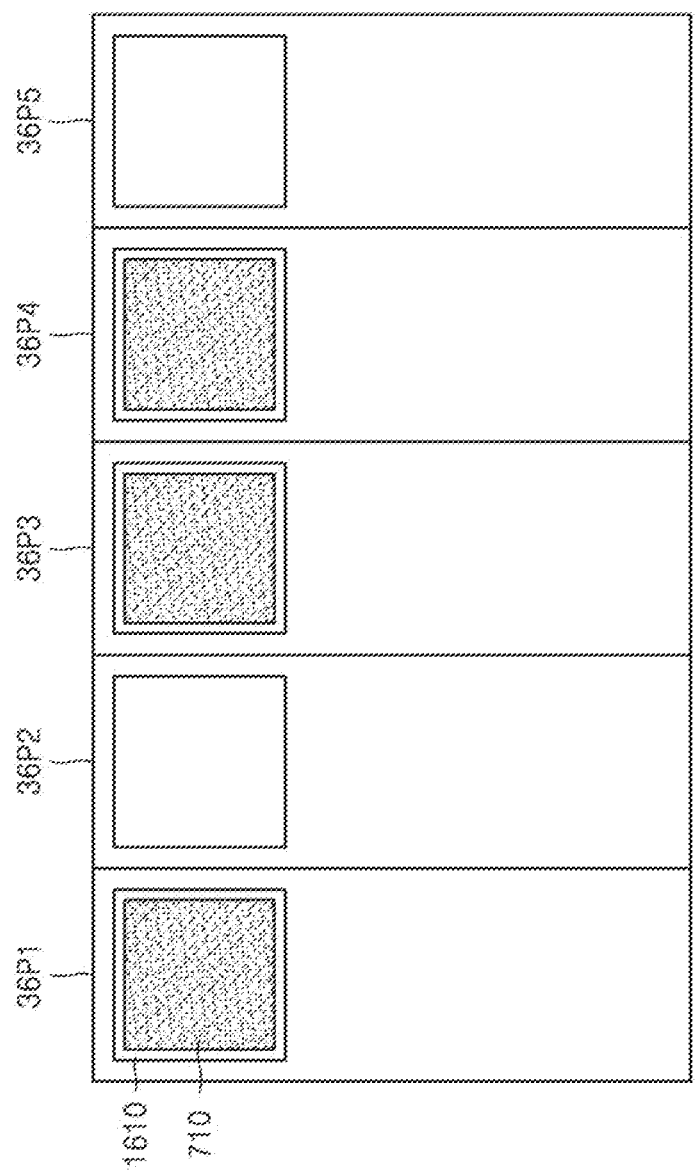
Figure 38:
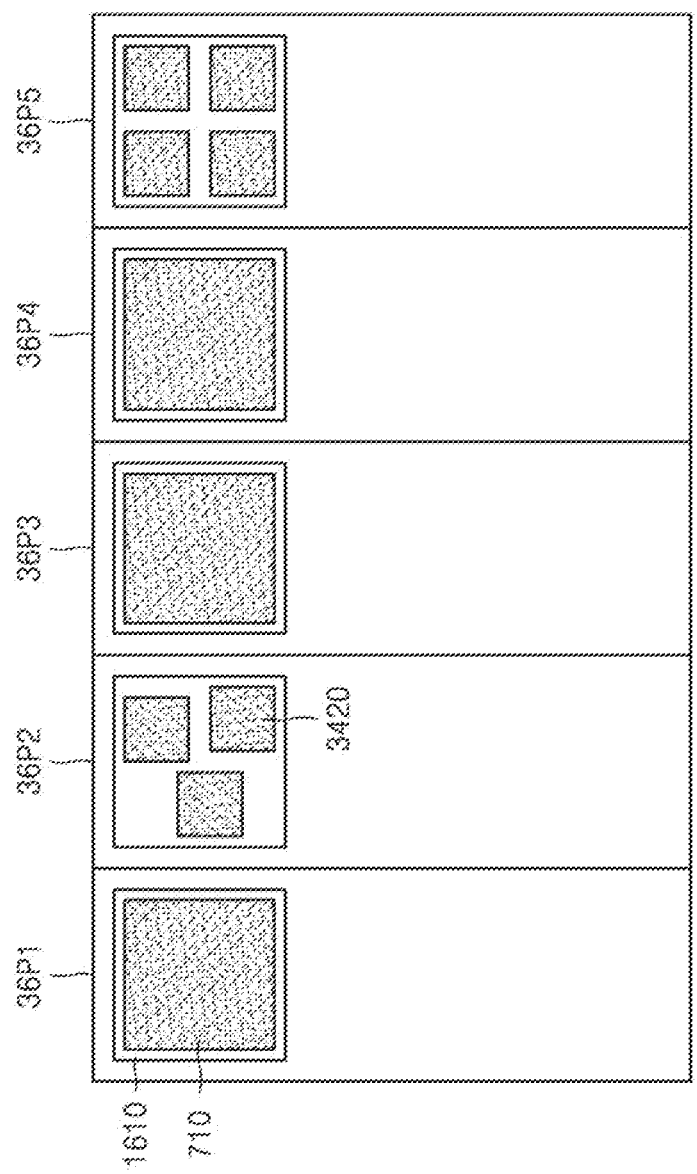

FIGS. 37 and 38 show an example of a result of performing first and second transfers on the transferring substrate 3600 of FIG. 36. In a first transfer, the ninth micro-LED 710 is used, and in a second transfer, an eighteenth micro-LED 3420 having a size less than the ninth micro-LED 710 is used.

Referring to FIG. 37, as a result of the first transfer, the ninth micro-LED 710 is transferred to the first transfer region 1610 of the first, third and fourth sub-pixel regions 36P1, 36P3, and 36P4, and the first transfer region 1610 of the second and fifth sub-pixel regions 36P2 and 36P5 remains as untransferred regions.

Referring to FIG. 38, by the secondary transfer, three or four eighteenth micro-LEDs 3420 are respectively transferred to the first transfer regions 1610 of the second and fifth sub-pixel regions 36P2 and 36P5 to which a micro-LED is not transferred in the first transfer.

Figure 39:
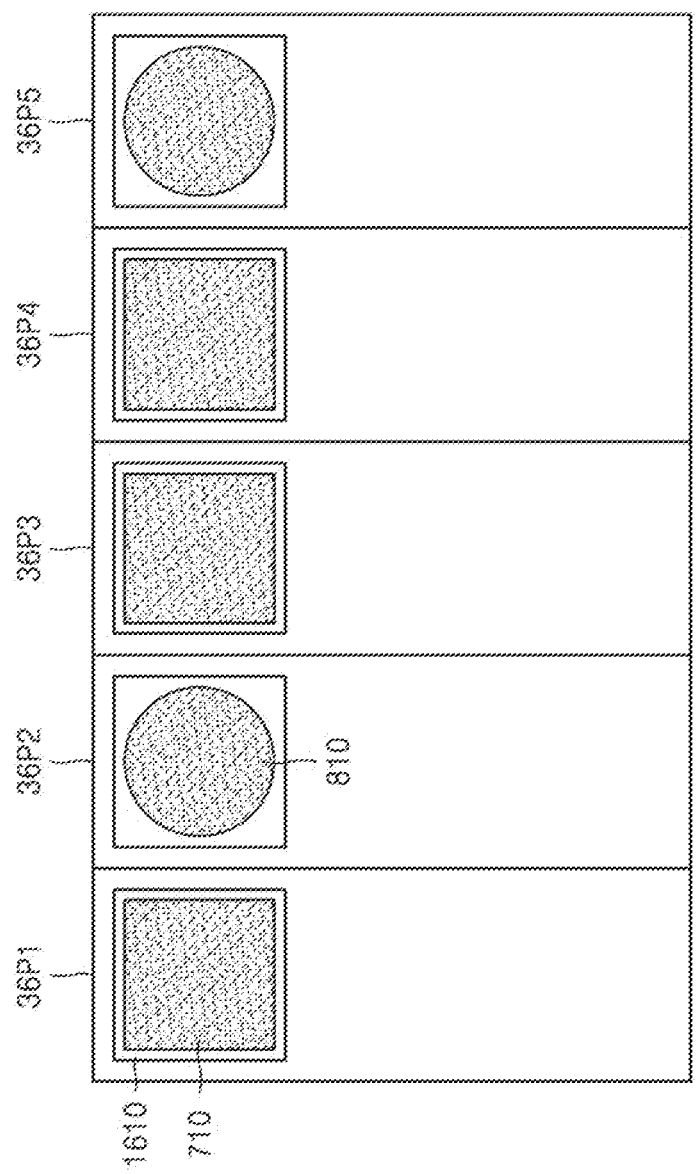

FIG. 39 shows a result when the sixth micro-LED 810 having a circular shape is used instead of the eighteenth micro-LED 3420 having a square shape in the second transfer in the transferring method shown in FIGS. 37 and 38.

Referring to FIG. 39, the ninth micro-LEDs 710 and the sixth micro-LEDs 810 are transferred to all of the first transfer regions 1610 of the first to fifth sub-pixel regions 36P1 to 36P5.

Figure 40:
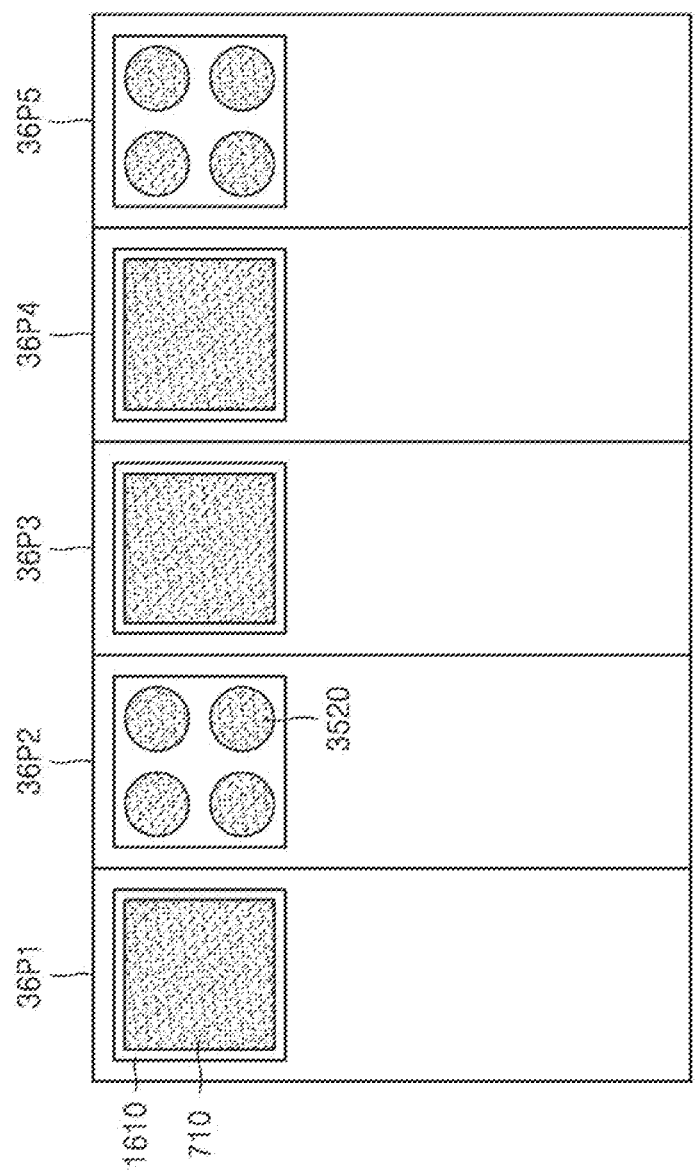

FIG. 40 shows a result when the nineteenth micro-LED 3520 having a small circular shape is used instead of the small square eighteenth micro-LED 3420 having a small square shape in the second transfer in the transferring method shown in FIGS. 37 and 38.

Referring to FIG. 40, the ninth micro-LEDs 710 and the nineteenth micro-LEDs 3520 are transferred to all of the first transfer regions 1610 of the first to fifth sub-pixel regions 36P1 to 36P5.

Figure 41:
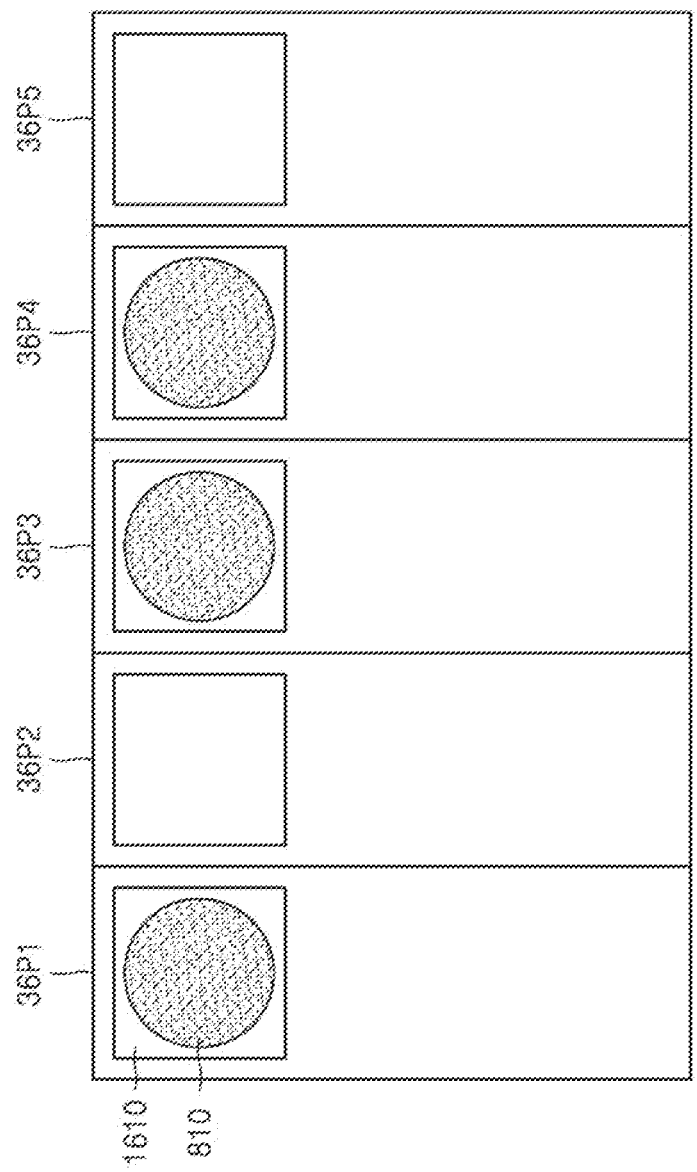
Figure 42:
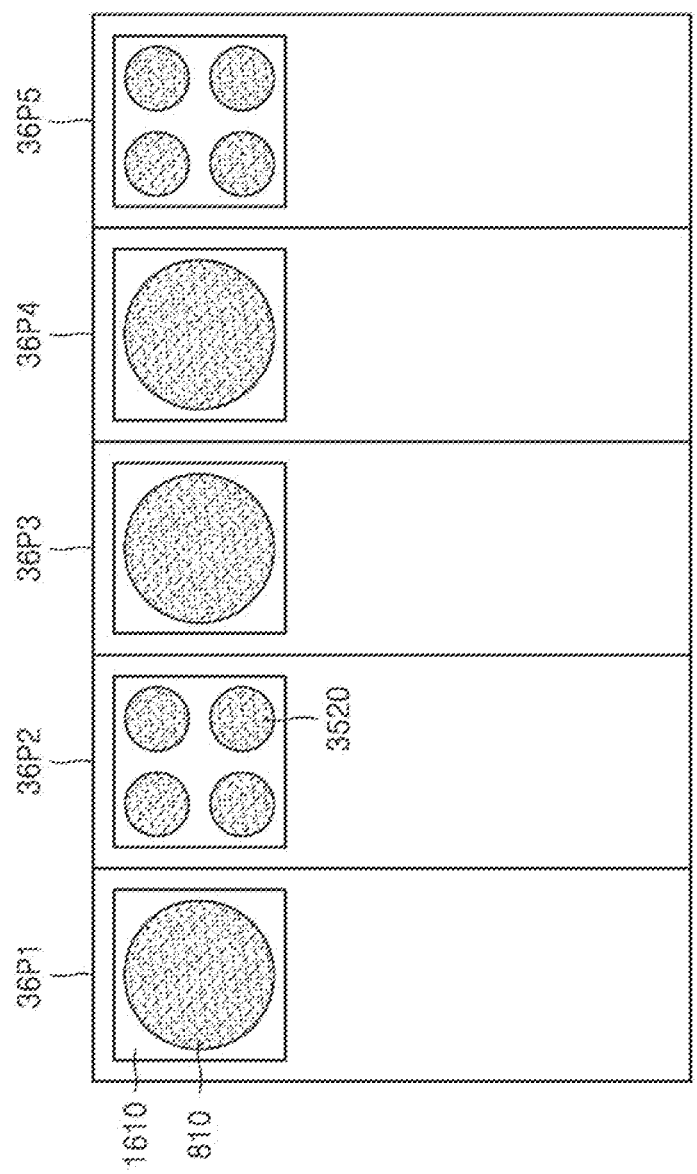

FIGS. 41 and 42 show a result that, in the first and second transfer with respect to the transferring substrate 3600 of FIG. 36, the sixth micro-LEDs 810 having a large circular shape is used in the first transfer and the nineteenth micro-LED 3520 is used in the second transfer.

Referring to FIGS. 41 and 42, by the secondary transfer, the nineteenth micro-LED 3520 is transferred to the first transfer regions 1610 of the second and fifth sub-pixel regions 36P2 and 36P5 which are remained as untransferred regions to which a micro-LED is not transferred in the first transfer.

Figure 43:
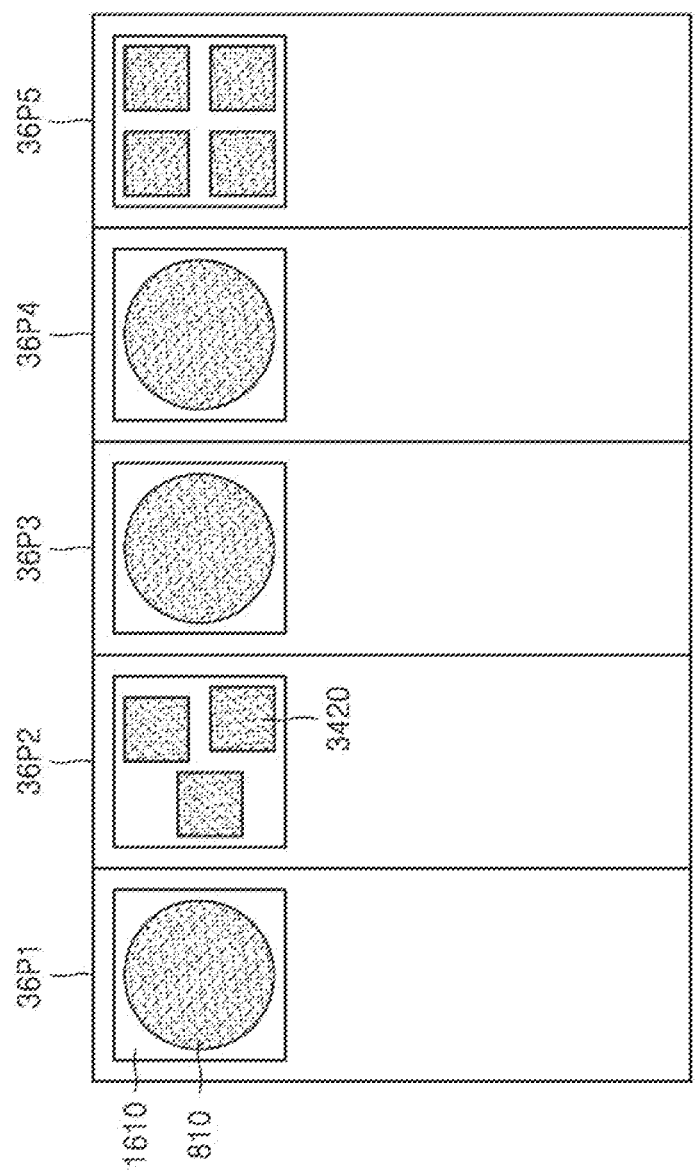

FIG. 43 shows a result when the eighteenth micro-LED 3420 having a square shape is used instead of the nineteenth micro-LED 3520 used in the second transfer in the transferring method shown in FIGS. 41 and 42.

Referring to FIG. 43, the sixth micro-LED 810 and the eighteenth micro-LED 3420 are transferred to all of the first transfer regions 1610 of the first to fifth sub-pixel regions 36P1 to 36P5.

Figure 44:
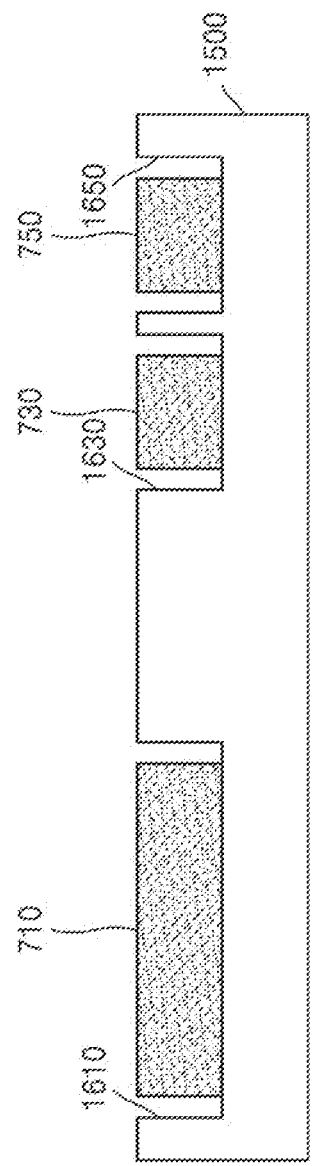
FIG. 44 is a cross-sectional view taken along a line 44-44' of FIG. 26 according to an example embodiment.

FIG. 44 shows a cross-sectional view taken along a line 44-44' of FIG. 26.

Referring to FIG. 44, the ninth micro-LED 710 is present in the first transfer region 1610 that is a first recess region of the transferring substrate 1500, and the eleventh and thirteenth micro-LEDs 730 and 750 are respectively present in the third and fifth transfer regions 1630 and 1650, which are second and third recess regions.

Figure 45:
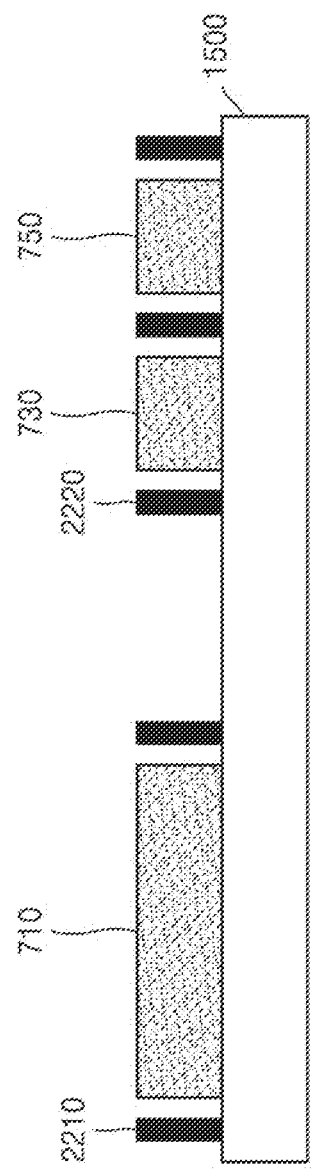
FIG. 45 is a cross-sectional view of a case that a mold defining a transfer region on a transferring substrate is provided and shows another example of a cross-sectional view taken along the line 44-44' of FIG. 26 according to another example embodiment.

FIG. 45 shows another example of cross-sectional view taken along a line 44-44' of FIG. 26.

Referring to FIG. 45, the ninth micro-LED 710 is present on the transferring substrate 1500 and is surrounded by a first mold 2210. Also, the eleventh and thirteenth micro-LEDs 730 and 750 separated from each other are present on the transferring substrate 1500, and each of the eleventh and thirteenth micro-LEDs 730 and 750 are respectively surrounded by a second mold 2220.

In the transferring method disclosed above, micro-LEDs having different sizes and/or shapes are used in combination. For example, among micro-LEDs used for transfer, micro-LEDs having a relatively large size (area) are transferred in a first transfer, and in a second transfer, micro-LEDs having a relatively small size are transferred or micro-LEDs having a size equivalent to the micro-LEDs used in the first transfer but having a higher symmetrical shape are transferred. When such a transferring method is used, the possibility of transferring micro-LEDs to untransferred regions to which the micro-LEDs are not transferred in the first transfer may increase, thereby increasing the transfer yield. Accordingly, since a repair process after transfer may be omitted or minimized, manufacturing cost may be reduced and manufacturing time may also be reduced. Also, since several small-sized micro-LEDs may replace one large-sized micro-LED, sufficient light emission efficiency may be secured.

Figure 46:
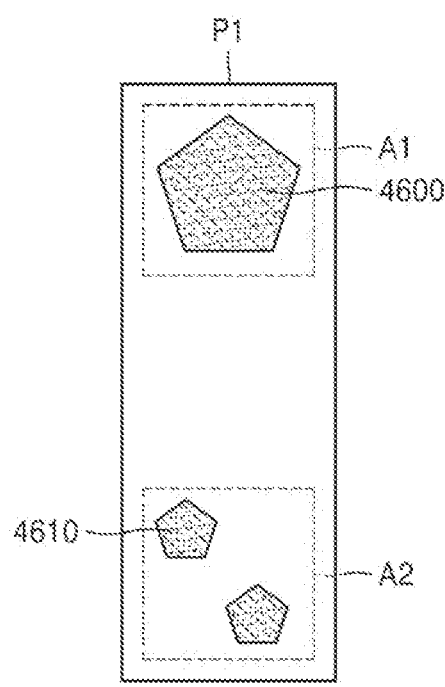
FIG. 46 is a plan view illustrating a case in which a pentagonal micro-LED is transferred to a subpixel included in the micro-LED display of FIG. 1.
Figure 47:
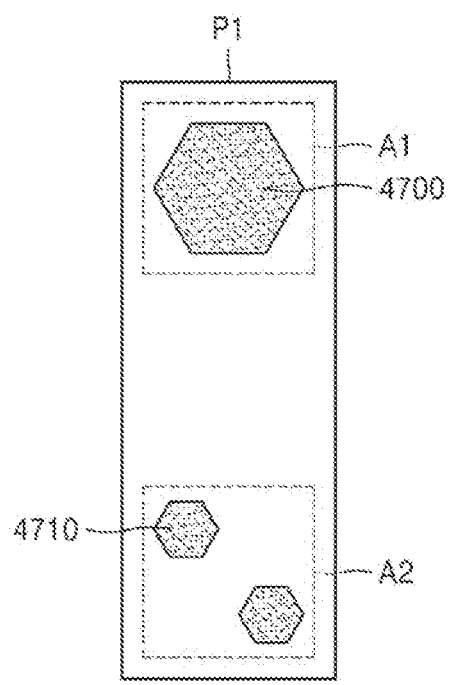
FIG. 47 is a plan view illustrating a case in which a hexagonal micro-LED is transferred to a subpixel included in the micro-LED display of FIG. 1.
Figure 48:
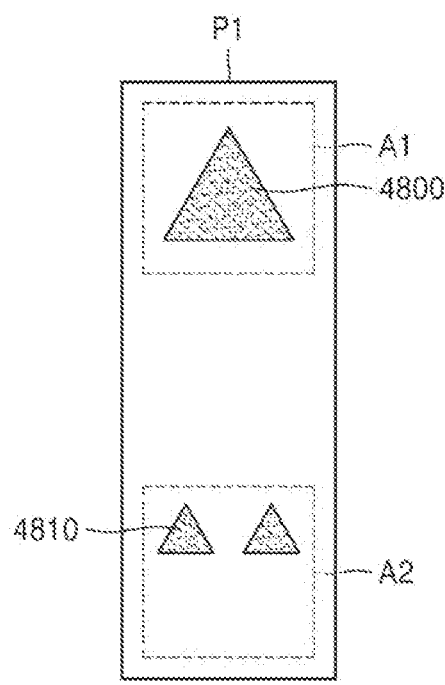
FIG. 48 is a plan view illustrating a case in which a triangular micro-LED is transferred to a subpixel included in the micro-LED display of FIG. 1.

Meanwhile, in the descriptions with reference to FIGS. 2 to 45, the micro-LEDs having a square or circular shape has been described, but the micro-LEDs may have a polygonal or non-circular shape. For example, as shown in FIG. 46, pentagonal micro-LEDs 4600 and 4610 may be transferred to the first and second regions A1 and A2 of the subpixel P1, as shown in FIG. 47, hexagonal micro-LEDs 4700 and 4710 may be transferred to the first and second regions A1 and A2 of the subpixel P1, and as shown in FIG. 48, triangular micro-LEDs 4800 and 4810 may be transferred to the first and second regions A1 and A2 of the subpixel P1.

Figure 49:
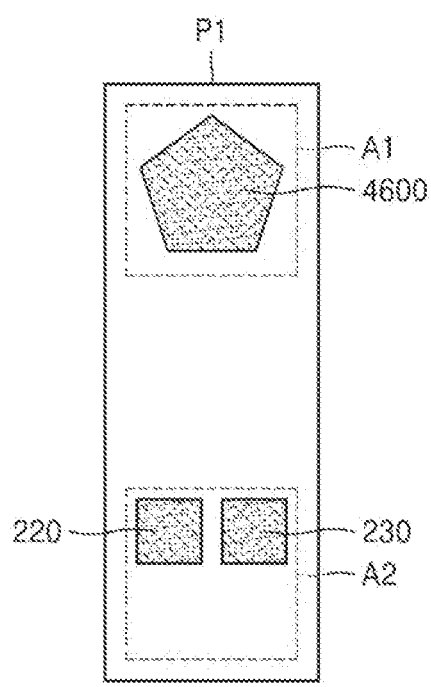
FIGS. 49, 50, and 51 are plan views illustrating cases in which a square micro-LED and a pentagonal micro-LED are transferred to a subpixel included in the micro-LED display of FIG. 1.
Figure 50:
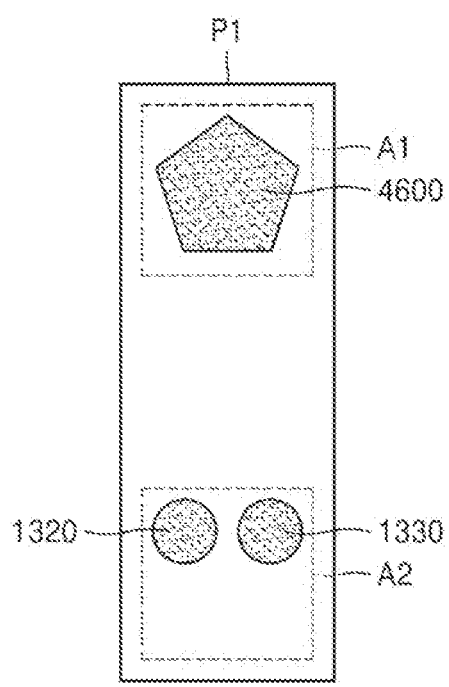
Figure 51:
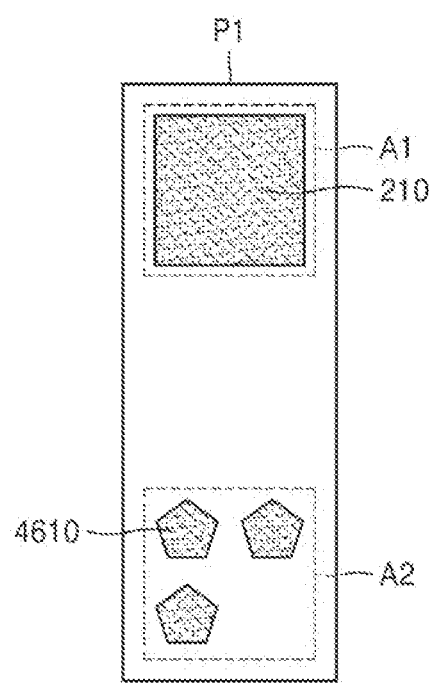
Figure 52:
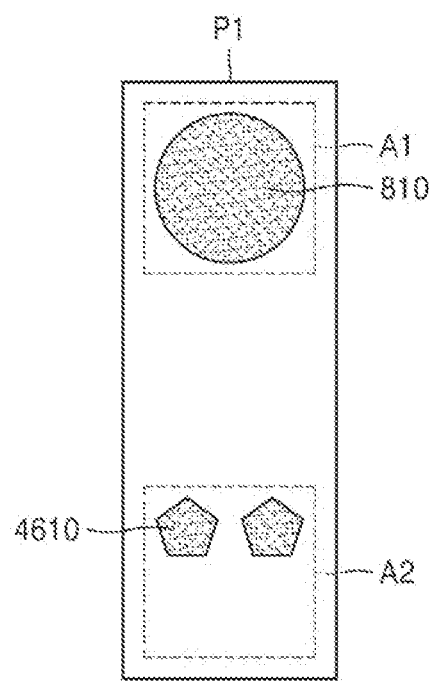

Also, as shown in FIGS. 49 to 52, the shapes of micro-LEDs that may be transferred to the first and second regions A1 and A2 of the subpixel P1 may be variously combined. FIG. 49 shows a case in which the pentagonal micro-LEDs 4600 is transferred to the first area A1 of the subpixel P1 and the square micro-LEDs 220 and 230 are transferred to the second area A2 of the subpixel P1. FIG. 50 shows a case in which the pentagonal micro-LEDs 4600 is transferred to the first area A1 of the subpixel P1 and the circular micro-LEDs 1320 and 1330 are transferred to the second area A2 of the subpixel P1. In FIGS. 49 and 50, the pentagonal micro-LED 4600 transferred to the first area A1 may be replaced with a hexagonal micro-LED or a triangular micro-LED. In addition, in FIG. 49, the square micro-LEDs 220 and 230 transferred to the second area A2 may be replaced with polygonal micro-LEDs other than pentagonal micro-LEDs, for example, triangular or hexagonal micro-LEDs. In addition, in FIG. 50, the circular micro-LEDs 1320 and 1330 transferred to the second area A2 may be replaced with polygonal micro-LEDs other than pentagonal micro-LEDs, for example, triangular or hexagonal micro-LEDs. FIG. 51 shows a case in which the square micro-LED 210 is transferred to the first area A1 and the pentagonal micro-LED 4610 is transferred to the second area A2. FIG. 52 shows a case in which the circular micro-LED 810 is transferred to the first area A1 and the pentagonal micro-LED 4610 is transferred to the second area A2. In FIGS. 51 and 52, the pentagonal micro-LED 4610 transferred to the second area A2 may be replaced with another type of polygonal micro-LED, for example, a triangular or hexagonal micro-LED. In addition, in the first region A1 in FIGS. 51 and 52, instead of the square or circular micro-LEDs 210 and 810, a polygonal micro-LED having shape different from a pentagonal micro-LED, for example, a triangular or hexagonal micro-LED may be transferred.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A micro-light emitting diode (LED) display comprising:
   a backplane substrate; and a plurality of sub-pixels provided on the backplane substrate,
wherein at least one sub-pixel from among the plurality of sub-pixels comprises:
a first region and a second region;
a first micro-LED provided in the first region; and
two or more second micro-LEDs that are different from the first micro-LED and provided in the second region,
wherein the first region and the second region have a same size of area, and
wherein the first micro-LED and the two or more second micro-LEDs have a same light emission characteristic, and a size of the first micro-LED is greater than a size of each of the two or more second micro-LEDs.

2. The micro-LED display of claim 1, wherein the first micro-LED has a first shape and each of the two or more second micro-LEDs has a second shape, and
wherein the first shape is different than the second shape.

3. The micro-LED display of claim 1, wherein the plurality of sub-pixels respectively comprise micro-LEDs configured to emit a same light.

4. The micro-LED display of claim 1, wherein, among the plurality of sub-pixels, a first group of sub-pixels comprise micro-LEDs configured to emit a first light, a second group of sub-pixels comprise micro-LEDs configured to emit a second light, and a third group of sub-pixels comprise micro-LEDs configured to emit a third light, and
wherein wavelengths of the first light, the second light, and the third light are different from one another.

5. The micro-LED display of claim 1, wherein each sub-pixel of remaining sub-pixels from among the plurality of sub-pixels, other than the at least one sub-pixel, comprises one micro-LED.

6. The micro-LED display of claim 1, wherein each sub-pixel of remaining sub-pixels from among the plurality of sub-pixels, other than the at least one sub-pixel, comprises a plurality of micro-LEDs respectively having a same shape.

7. The micro-LED display of claim 1, wherein each sub-pixel of remaining sub-pixels from among the plurality of sub-pixels, other than the at least one sub-pixel, comprises a micro-LED that has a shape that is the same or different from a shape of one of the first micro-LED and the two or more second micro-LEDs.

8. The micro-LED display of claim 1, wherein the first micro- LED and the two or more second micro-LEDs have a polygon shape or circular shape.

9. The micro-LED display of claim 2, wherein one of the first micro-LED and the two or more second micro-LEDs has a polygon shape or circular shape.

10. A micro-light emitting diode (LED) transferring substrate comprising:
a plurality of sub-pixel regions,
wherein each sub-pixel region of the plurality of sub-pixel regions comprises:
a first transfer region to which a first micro-LED is transferred; and
a second transfer region to which two or more second ismicro-LEDs are transferred, the second micro-LED being different from the first micro-LED,
wherein the first transfer region and the second transfer region have a same size of area, and
wherein the first micro-LED and the two or more second micro-LEDs have a same light emission characteristic, and a size of the first micro-LED is greater than a size of each of the two or more second micro-LEDs.

11. The micro-LED transferring substrate of claim 10, wherein a mold is provided around the first transfer region and the second transfer region.

12. The micro-LED transferring substrate of claim 10, wherein a shape of the first micro-LED and a shape of the two or more second micro-LEDs are the same, and
wherein a size of the first micro-LED and a size of the two or more second micro-LEDs are different.

13. The micro-LED transferring substrate of claim 10, wherein a shape of the first micro-LED and a shape of the two or more second micro-LEDs are different, and
wherein a size of the first micro-LED and a size of the second micro-LED are different.

14. A method of transferring micro-light emitting diodes (LEDs), the method comprising:
transferring a first micro-light emitting diode (LED) to a first region included in at least one of a plurality of sub-pixels; and
transferring a two or more second micro-LEDs to a second region included in the at least one of the plurality of sub-pixels,
wherein the transferring of the first micro-LED and the transferring of the two or more second micro-LEDs are sequentially performed to transfer the first micro-LED and the two or more second micro-LEDs to each of the at least one of the plurality of sub-pixels,
wherein a size of the second micro-LED is less than a size of the first micro-LED,
wherein the first region and the second region have a same size of area, and
wherein the first micro-LED and the two or more second micro-LEDs have a same light emission characteristic, and a size of the first micro-LED is greater than a size of each of the two or more second micro-LEDs.

15. The method of claim 14, further comprising:
determining whether there is a sub-pixel to which the first micro-LED is not transferred between the transferring of the first micro-LED and the transferring of the two or more second micro-LEDs.

16. The method of claim 14, wherein the transferring of the first micro-LED further comprises:
transferring the first micro-LED having a first shape; and
transferring the first micro-LED having a second shape different from the first shape.

17. The method of claim 14, wherein the first micro-LED has a polygon shape or circular shape.

18. The method of claim 14, wherein the second micro-LED has a polygon shape or circular shape.

19. The method of claim 17, wherein the second micro-LED has a polygon shape or circular shape.

* * * * *